(12) United States Patent
Buck

(10) Patent No.: US 11,081,822 B2
(45) Date of Patent: *Aug. 3, 2021

(54) PRINTED CIRCUIT BOARD HAVING COMMONED GROUND PLANE

(71) Applicant: Samtec, Inc., New Albany, IN (US)

(72) Inventor: Jonathan E. Buck, Hershey, PA (US)

(73) Assignee: Samtec, Inc., New Albany, IN (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/988,923

(22) Filed: Aug. 10, 2020

(65) Prior Publication Data

US 2020/0373696 A1  Nov. 26, 2020

Related U.S. Application Data

(63) Continuation of application No. 16/614,048, filed as application No. PCT/US2018/032693 on May 15, 2018, now Pat. No. 10,784,608.

(Continued)

(51) Int. Cl.
| | |
|---|---|
| *H01R 12/73* | (2011.01) |
| *H01R 12/71* | (2011.01) |
| *H01R 12/72* | (2011.01) |
| *H01R 13/514* | (2006.01) |
| *H01R 13/6471* | (2011.01) |
| *H01R 13/6585* | (2011.01) |
| *H05K 1/02* | (2006.01) |
| *H05K 1/11* | (2006.01) |

(52) U.S. Cl.
CPC ......... *H01R 12/737* (2013.01); *H01R 12/716* (2013.01); *H01R 12/721* (2013.01); *H01R 13/514* (2013.01); *H01R 13/6471* (2013.01); *H01R 13/6585* (2013.01); *H05K 1/0251* (2013.01); *H05K 1/115* (2013.01)

(58) Field of Classification Search
CPC .. H01R 12/737; H01R 12/716; H01R 12/721; H01R 13/514; H01R 13/6471; H01R 13/6585; H05K 1/0251; H05K 1/115

See application file for complete search history.

(56) References Cited

U.S. PATENT DOCUMENTS

| | | | |
|---|---|---|---|
| 6,040,524 | A | 3/2000 | Kobayashi et al. |
| 8,298,009 | B2 | 10/2012 | Elkhatib et al. |

(Continued)

FOREIGN PATENT DOCUMENTS

| | | |
|---|---|---|
| CN | 103250306 A | 8/2013 |
| CN | 204539638 U | 8/2015 |

(Continued)

OTHER PUBLICATIONS

Cinch High Speed Cables, Cinch New FDR/EDR Cables, Paddle Card and Characteristics presentation, Mar. 2011, 7 pages.

(Continued)

*Primary Examiner* — Briggitte R. Hammond
(74) *Attorney, Agent, or Firm* — BakerHostetler

(57) ABSTRACT

An electrical connector includes a substrate that includes a plurality of ground traces at first and second surfaces of the substrate, and a ground coupling assembly that couples pairs of ground traces at each of the first and second surfaces, and further couples the ground traces at the first surface to the ground traces at the second surface.

15 Claims, 10 Drawing Sheets

Related U.S. Application Data

(60) Provisional application No. 62/506,101, filed on May 15, 2017.

(56) References Cited

U.S. PATENT DOCUMENTS

| | | | |
|---|---|---|---|
| 8,764,464 | B2 | 7/2014 | Buck et al. |
| 9,277,649 | B2 * | 3/2016 | Ellison ................. H01R 12/523 |
| 9,660,386 | B2 | 5/2017 | Ray et al. |
| 9,871,325 | B2 | 1/2018 | Patel et al. |
| 2004/0094328 | A1 | 5/2004 | Fjelstad et al. |
| 2007/0128891 | A1 | 6/2007 | Ling |
| 2012/0156938 | A1 | 6/2012 | Zhang |
| 2012/0190217 | A1 | 7/2012 | Tseng |
| 2013/0309906 | A1 | 11/2013 | De Geest Jan |
| 2014/0349496 | A1 | 11/2014 | Zhu et al. |
| 2015/0031242 | A1 | 1/2015 | Hasegawa et al. |
| 2015/0255904 | A1 | 9/2015 | Ito |
| 2015/0311960 | A1 | 10/2015 | Samardzija et al. |
| 2016/0085899 | A1 | 3/2016 | Qian et al. |

FOREIGN PATENT DOCUMENTS

| | | |
|---|---|---|
| CN | 106206539 A | 12/2016 |
| WO | 20131055567 A2 | 4/2013 |

OTHER PUBLICATIONS

Cinch, QSFP+ High Speed Cables with PairShield (trademark) Technology, rep training, Jan. 2010, 31 pages.

\* cited by examiner pass# PRINTED CIRCUIT BOARD HAVING COMMONED GROUND PLANE

CROSS-REFERENCE TO RELATED APPLICATIONS

This application is a continuation of U.S. patent application Ser. No. 16/614,048 filed Nov. 15, 2019, which is the National Stage Application of International Patent Application No. PCT/US2018/032693 filed May 15, 2018, which claims priority to U.S. Patent Application Ser. No. 62/506,101 filed May 15, 2017, the disclosure of each of which is hereby incorporated by reference as if set forth in its entirety herein.

BACKGROUND

Electrical connectors typically include a plurality of electrical conductors that are configured to transmit electrical signals between respective electrical components. With the continued miniaturization of electronic devices, and the ever-increasing desire for high-speed electronic communications, maintaining signal integrity, including managing resonance frequencies, is an important consideration in electrical connector design.

SUMMARY

In one embodiment, a substrate includes a body that defines a leading end, a trailing end, first and second sides, and first and second outer surfaces. The trailing end is opposite the leading end along a longitudinal direction. The end is configured to be inserted into a receptacle of a complementary electrical connector in a mating direction that is oriented along the longitudinal direction. The first and second sides are spaced from each other along a lateral direction that is substantially perpendicular to the longitudinal direction. The first and second outer surfaces are spaced from each other along a transverse direction that is substantially perpendicular to each of the longitudinal direction and the lateral direction. The substrate can further include at least one electrically conductive signal trace at the first surface and elongate along the longitudinal direction. The substrate can further include at least one electrically conductive ground trace at the first surface and elongate along the longitudinal direction. At least a portion of the at least one ground trace can be aligned with at least a portion of the at least one signal trace along the lateral direction. The at least one signal trace and the at least one ground trace can have respective mating ends that are configured to mate with complementary signal and ground contacts, respectively, of the complementary electrical connector. The substrate can include an electrically conductive ground plate disposed between the first surface and the second surface. The ground plate can be aligned with the mating end of the at least one ground trace along the transverse direction, such that no portion of the ground plate is aligned with the mating end of the at least one signal trace along the transverse direction.

DETAILED DESCRIPTION

Electrical performance of existing electrical edge-card connector systems having differential signal pairs, such as PCIe, mini-SAS HD connectors, CXP connectors, QSFP+ connectors, can be improved by electrically connecting ground contacts within the respective connectors.

Figure 1A:
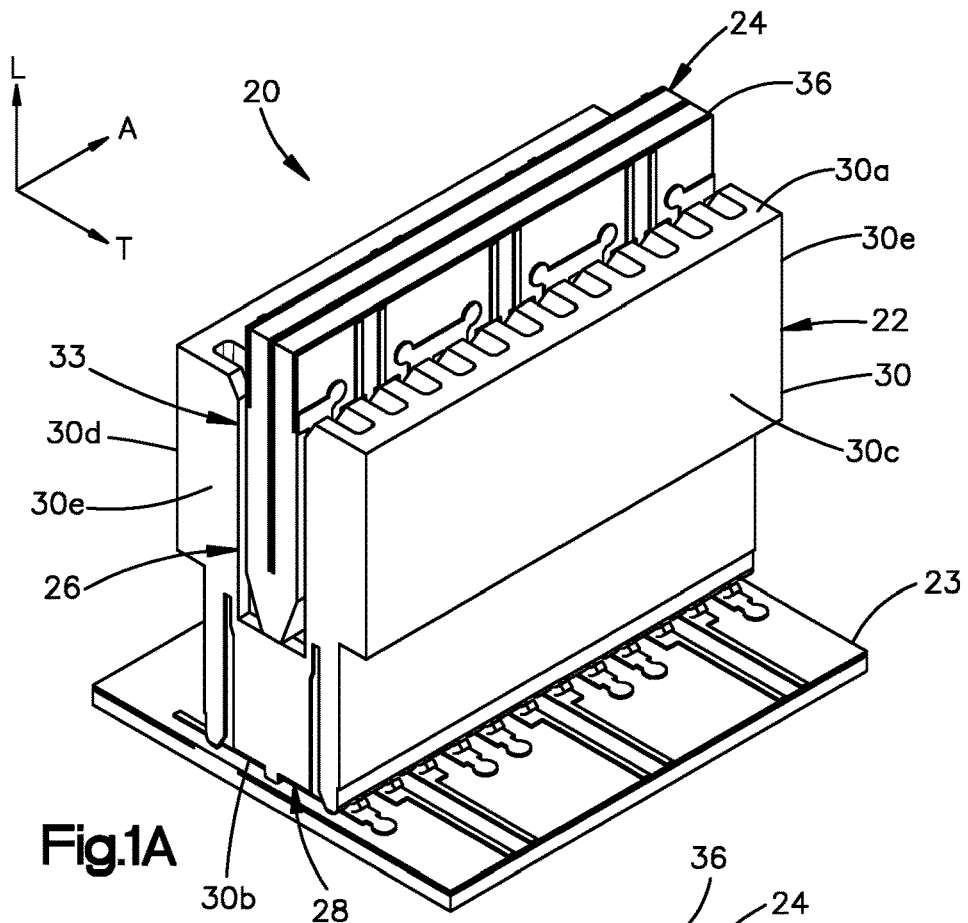
FIG. 1A is a perspective view of an electrical connector system including a substrate of a first electrical connector shown mated with a second electrical connector.
Figure 1B:
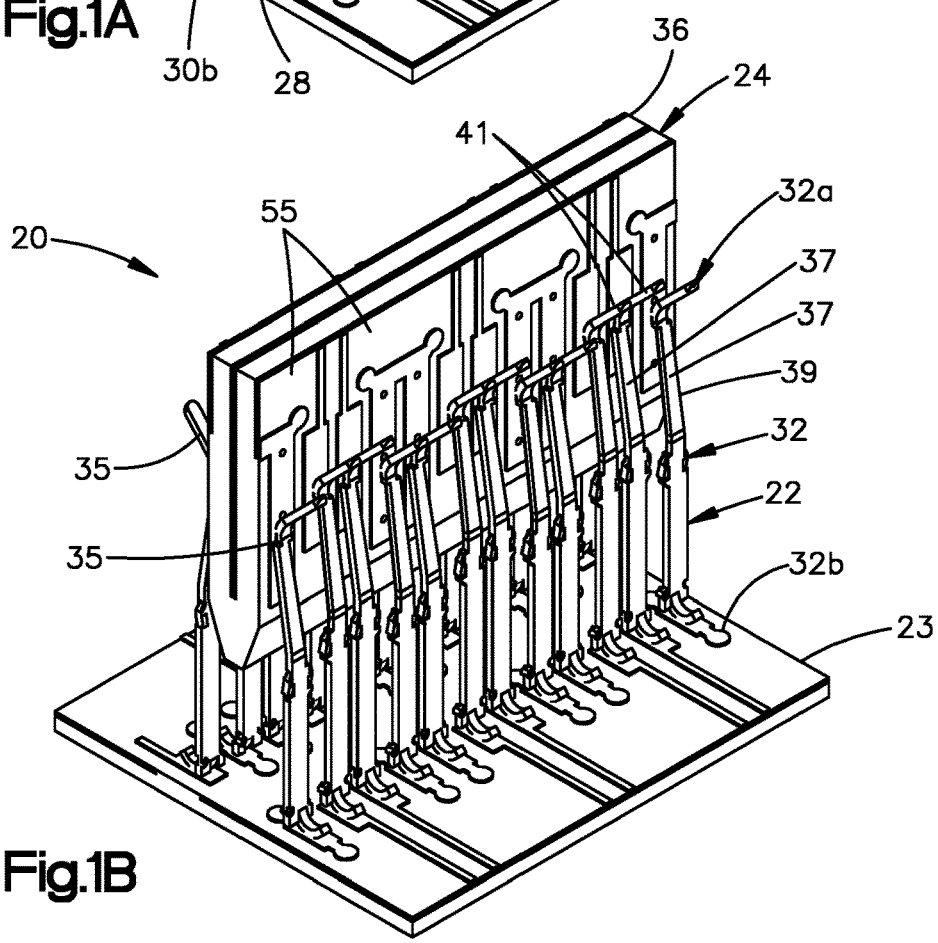
FIG. 1B is a perspective view of the electrical connector system illustrated in FIG. 1A, but shown with portions removed.
Figure 1C:
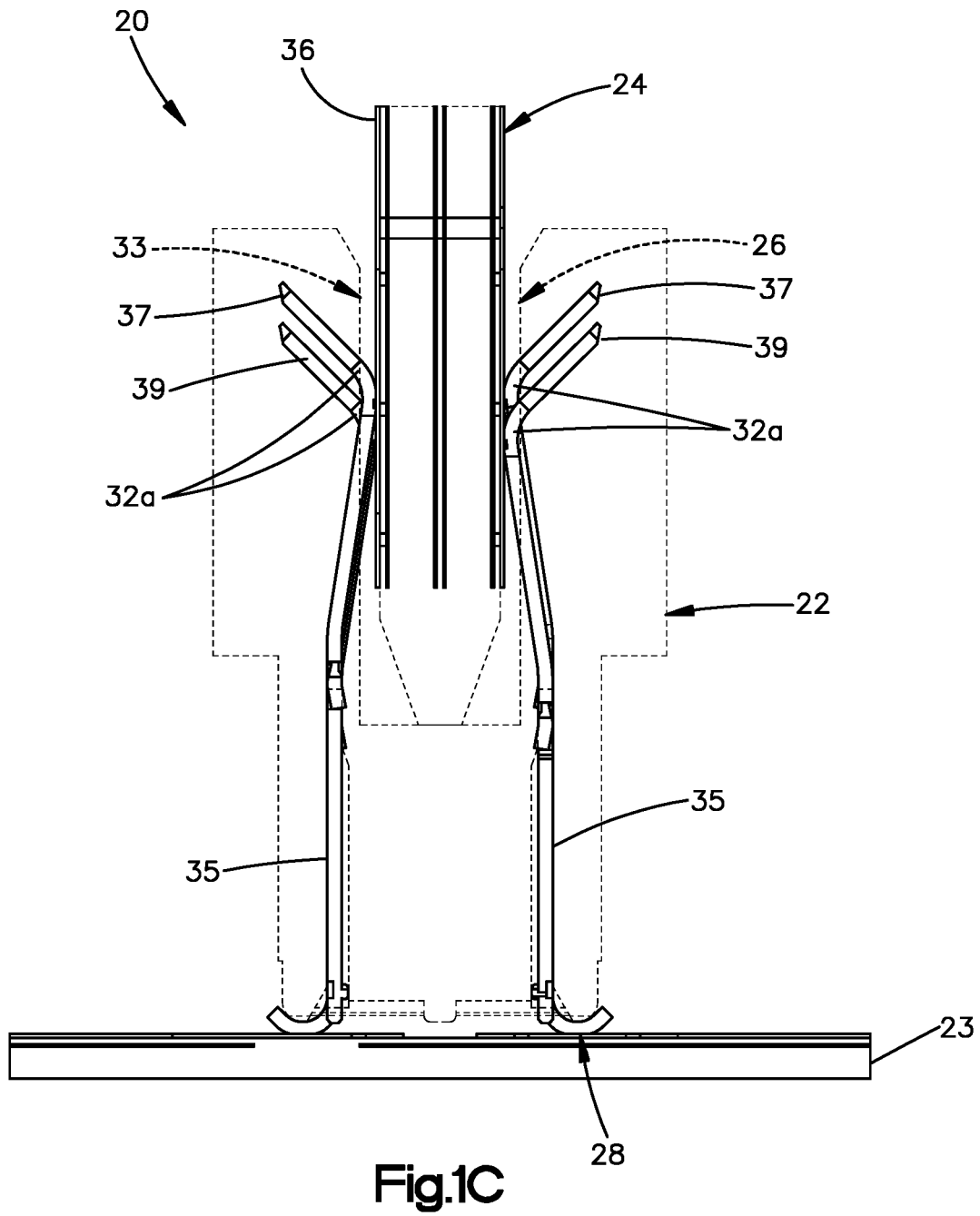
FIG. 1C is a side elevation view of the electrical connector system illustrated in FIG. 1A, but shown with portions removed.

Referring to FIGS. 1A-1C, an electrical connector assembly 20 constructed in accordance with one embodiment includes a first electrical connector 22 and a complementary second electrical connector 24, such that the first and second electrical connectors 22 and 24 are configured to be mated with each other. In one example, the first electrical connector 22 is a receptacle connector. The second electrical connector 24 is a plug connector that is configured to be received by the first connector 22 so as to mate the first and second electrical connectors 22 and 24. It is recognized that the second electrical connector 24 can be configured as a substrate having a card edge that is inserted into the receptacle of the first electrical connector 22 so as to establish data communication between the first electrical connector 22 and the second electrical connector 24.

That is, the first electrical connector 22 can define a first or mating interface 26 configured to mate with the second electrical connector 24 so as to establish an electrical connection between the first and second electrical connectors 22 and 24. The first electrical connector defines a second or mounting interface 28 configured to be mounted onto a corresponding electrical component 23, such as a substrate which can be a printed circuit board, so as to establish an electrical connection between the first electrical connector 22 and the corresponding electrical component. Alternatively, the corresponding electrical component 23 can be configured as a plurality of electrical cables. Thus, when the first electrical connector 22 is fully mated with the second electrical connector 24 and the corresponding electrical component, the first electrical connector 22 places the substrate and the second electrical connector 24 in electrical communication with each other.

The first electrical connector 22 includes a dielectric or electrically insulative first connector housing 30 and a plurality of electrical contacts 32 that are supported by the first connector housing 30. The first connector housing 30 defines a front end 30a and an opposed rear end 30b that is spaced from the front end 30a along a longitudinal direction L, a top 30c and an opposed bottom 30d that is spaced from the top 30c along a transverse direction T that is substantially perpendicular to the longitudinal direction L, and opposed sides 30e that are spaced from each other along a lateral direction A that is perpendicular to both the transverse direction T and the longitudinal direction L. Unless otherwise indicated herein, the terms "lateral," "longitudinal," and "transverse" are used to describe the orthogonal directional components of various components. The terms "inboard" and "inner," and "outboard" and "outer" and like terms when used with respect to a specified directional component are intended to refer to directions along the directional component toward and away from the center of the apparatus being described.

As will be appreciated from the description below, the front end 30a can define the mating interface 26 that is configured to be mated to the mating interface of the second electrical connector 24 along the longitudinal direction L, which can define a mating direction. The rear end 30b can define the mounting interface 28 that is configured to be mounted onto the corresponding electrical component along the transverse direction T, which can define a mounting direction. Because the mating interface 26 is oriented parallel with respect to the mounting interface 28, the electrical connector 22 can be referred to as a vertical electrical connector. Alternatively, the electrical connector 22 can be configured as a right-angle electrical connector, whereby the mating interface 26 is oriented substantially perpendicular to the mounting interface 28.

It should be appreciated that while the longitudinal and lateral directions are illustrated as extending along a horizontal plane, and that the transverse direction is illustrated as extending along a vertical plane, the planes that encompass the various directions may differ during use, depending, for instance, on the orientation of the various components. Accordingly, the directional terms "vertical" and "horizontal" are used to describe the connector assembly 20 and its components as illustrated merely for the purposes of clarity and convenience, it being appreciated that these orientations may change during use.

Each of the electrical contacts 32 defines a mating end 32a that is disposed proximate to the mating interface 26 and configured to mate with a mating end of the complementary electrical contacts of the second electrical connector 24 when the first electrical connector 22 is mated to the second electrical connector 24. Each of the electrical contacts 32 further defines a mounting end 32b that is configured to be mounted to the corresponding electrical component. In accordance with the illustrated embodiment, the mating ends 32a are orientated along the longitudinal direction L, and the mounting ends 32b are orientated along the transverse direction T. Because the mating ends 32a are orientated parallel to the mounting end 32b, the electrical contacts 32 can be referred to as vertical electrical contacts. Alternatively, the electrical contacts 32 can be configured as right-angle electrical contacts, whereby the mating ends 32a are oriented substantially perpendicular to the mounting ends 32b.

The electrical contacts 32 can be arranged as desired. For instance, in accordance with the illustrated embodiment, the mating ends 32a of the electrical contacts 32 define at least one pair of first and second rows 35 that are spaced from each other along the transverse direction T at the mating interface 26. Each row 35 can be oriented along the lateral direction A. Thus, the mating ends 32a of the electrical contacts 32 of each row 35 can be said to be spaced from each other along the lateral direction A. The mounting ends of the electrical contacts 32 can define rows that are spaced from each other along the longitudinal direction L at the mounting interface 28. The electrical connector 22 can define at least one receptacle 33 at the mating interface 26 defined between each of the pair of adjacent first and second rows 35, the adjacent first and second rows 35 being adjacent along the transverse direction T.

While the first electrical connector 22 is shown having a single slot or receptacle 33 defined between rows of a single pair of rows, it is recognized that each receptacle 33 can be defined between rows of more than one pair of rows, such as between two or more pairs of rows. Further, it should be appreciated that the mating ends 32a of electrical contacts 32 can alternatively define first and second pairs of rows 35, and the first electrical connector 22 can include first and second receptacles 33 that are spaced from each other along the transverse direction T and configured to receive a corresponding substrate or alternatively constructed mating end of the second electrical connector 24 so as to mate the first electrical connector 22 to the second electrical connector 24. Thus, the first electrical connector 22 can be referred to as a receptacle connector whose electrical contacts 32 are configured to receive the mating end of the second electrical connector 24. It should be appreciated that the electrical connector 22 can define any number of receptacles 33 as desired, for instance at least one receptacle. Each receptacle 33 can be elongate along the lateral direction A and configured to receive the mating end of the second electrical connector 24 along the longitudinal mating direction.

Each receptacle 33 is defined by opposed mating ends 32a of electrical contacts 32 that are spaced from each other along the transverse direction T, and thus disposed on opposite sides of the receptacle 33. Thus, the opposed mating ends 32a of each receptacle 33 are configured to establish an electrical connection with opposed surfaces of the substrate of the second electrical connector 24 that is inserted in the receptacle 33.

At least one up to all of the electrical contacts 32 can define signal contacts 37 and at least one such as a plurality of the electrical contacts 32 can define ground contacts 39 that can be disposed between adjacent signal contacts 37. For instance, one or more of the ground contacts 39 can be disposed between adjacent pairs of signal contacts 37. For instance, adjacent signal contacts 37 of each row 35 that are spaced along the lateral direction A can define differential signal pairs 41, and the ground contacts 39 can be disposed between adjacent differential signal pairs 41 along the row 35, or can be otherwise disposed as desired. Alternatively, the signal contacts 37 can be single ended contacts. The electrical contacts 32 can define a repeating S-S-G-G pattern, S-S-G pattern, G-S-S pattern, S-G-S pattern along the lateral direction A in the respective row 35, or can define any other pattern as desired, wherein "S" identifies a signal contact 37 and "G" identifies a ground contact 39.

The electrical contacts 32 of the first row 35 of a respective receptacle 33 can be inline with the electrical contacts 32 of the second row 35 of the respective receptacle 33 along the transverse direction T. However, the pattern of electrical contacts 32 of the first row 35 of a respective receptacle 33 can be offset with respect to the pattern of electrical contacts 32 of the second row 35 of the respective receptacle. For instance, the electrical contacts of both the first and second rows 35 can each include a pair of immediately adjacent ground contacts 39 that are disposed between immediately adjacent pairs of signal contacts 37. However, because the patterns at the first and second rows 35 can be offset with respect to each other in one example, the pair of immediately adjacent ground contacts 39 of the first row are not aligned with the pair of immediately adjacent ground contacts 39 of the second row 35 along the transverse direction T. Similarly, the immediately adjacent pairs of signal contacts 37 of the first row are not aligned with the immediately adjacent pairs of signal contacts 37 at of the second row along the transverse direction T. Alternatively, the patterns at the first and second rows 35 can be identical with each other and aligned with each other, such that all signal contacts and ground contacts of the first row 35 are aligned with all signal contacts and ground contacts, respectively, at the second row 35 along the transverse direction T.

With continuing reference to FIGS. 1A-3E, the second electrical connector 24 can include a dielectric or electrically insulative second connector housing, if desired. The second electrical connector can define at least one substrate 36. The substrate 36 can be configured as a stand-alone card edge substrate as described above, or can be carried by the second connector housing. The substrate 36 can include a respective dielectric or electrically nonconductive substrate body 51. The body 51 defines a leading 51a and a trailing end 51b that is opposite the leading end 51a along the longitudinal direction L. The leading end 51a is configured to be inserted into the receptacle 33 of the complimentary first electrical connector 22 in a mating direction. Thus, the terms "front," "forward," and derivatives thereof can refer to the mating direction unless otherwise indicated. Similarly, the terms "rear," "rearward," and derivatives thereof can refer to a direction opposite the mating direction unless otherwise indicated.

The leading end 51a can be tapered inwardly in the transverse direction T as it extends in the mating direction. The mating direction is oriented along the longitudinal direction. Thus, it can be said that the front or leading end 51a is spaced from the rear or trailing end 51b in the mating direction. The substrate 36 further first and second sides 51c and 51d that are spaced from each other along the lateral direction A that is substantially perpendicular to the longitudinal direction L. The substrate 36 can further define first and second outer surfaces 51e and 51f that are spaced from each other along the transverse direction T that is substantially perpendicular to each of the longitudinal direction L and the lateral direction A. The first and second outer surfaces 51e and 51f are spaced from each other along the transverse direction T so as to define a thickness of the substrate 36. The first surface 51e can be an upper surface, and the second surface 51f can be a lower surface as illustrated. It should however, be appreciated that the orientation of the substrate 36 can differ during use. The first and second sides 51c and 51d are spaced from each other along the lateral direction A so as to define a width of the substrate 36. The leading and trailing ends 51a and 51b are spaced from each other along the longitudinal direction so as to define a length of the substrate 36. The thickness is less than each of the width and the length. The width can be less than the length. Thus, the length can be greater than each of the thickness and the width.

Each of the leading end 51a and the trailing end 51b can lie in respective planes that are defined by the lateral direction A and the transverse direction T. Each of the first and second sides 51c and 51d can lie in respective planes that are defined by the longitudinal direction L and the transverse direction T. Each of the first and second outer surfaces 51e and 51f can lie in respective planes that are defined by the lateral direction A and the longitudinal direction L.

The substrate 36 can further include a plurality of electrically conductive traces that are supported by the substrate body 51. In particular, the substrate 36 can include at least one signal trace 43 that is supported by the substrate body 51. For instance, the at least one signal trace 43 can be disposed at the first surface 51e. In one example, the at least one signal trace 43 can include a plurality of signal traces 43. The substrate 36 can further include at least one ground pad or trace 45 that is supported by the substrate body 51. For instance, the at least one ground trace 45 can be disposed at the first surface 51e. In one example, the at least one ground trace 45 can include a plurality of ground traces 45. The substrate 36 can define a printed circuit board. Thus, the substrate body 51 can be configured as a printed circuit board body. The at least one signal trace 43 can be elongate along the longitudinal direction L. Thus, the at least one signal trace 43 defines a dimension along the longitudinal direction L that is greater than each of the lateral direction A and the transverse direction T. While the at least one signal trace 43 may extend in a straight linear direction, the signal trace 43 can alternatively be curved. signal Similarly, the at least one ground trace 45 can be elongate along the longitudinal direction L. Thus, the at least one ground trace 45 defines a dimension along the longitudinal direction L that is greater than each of the lateral direction A and the transverse direction T. While the at least one ground trace 45 may extend in a straight linear direction, the signal trace 43 can alternatively be curved.

The signal traces 43 can be aligned with each other in their respective entireties along the lateral direction A. Similarly, the ground traces 45 can be aligned with each other in their respective entireties along the lateral direction A. At least a portion of each of the signal traces 43 can be aligned with at least a portion of each of the ground traces 45 along the lateral direction A. The ground traces 45 can extend further in the mating direction than the signal traces 43. Each at least one signal trace 43 terminates in the mating direction at a signal mating end 43a that is configured to mate with mating ends 32a of a respective different one of the signal contacts 37 of the first electrical connector when the leading end 51a is inserted into the receptacle 33. The signal traces 43 further define termination ends 43b opposite the mating ends 43a along the longitudinal direction L.

Similarly, each at least one ground trace 45 terminates in the mating direction at a ground mating end 45a that is configured to mate with mating ends 32a of a respective different one of the ground contacts 39 of the first electrical connector 22 when the leading end 51a is inserted into the receptacle 33. The ground traces 45 can define respective termination ends 45*b* that are disposed opposite the mating ends 45*a* with respect to the longitudinal direction L. The mating ends 43*a* of the signal traces 43 can be aligned with each other along the lateral direction A. Similarly, the mating ends 45*a* of the ground traces 45 can be aligned with each other along the lateral direction A. The mating ends 45*a* of the ground traces 45 can be offset with respect to the mating ends 43*a* of the signal traces 43 in the mating direction. Thus, the mating ends 45*a* of the ground traces 45 terminate in the mating direction at a first location, and the mating ends 43*a* of the signal traces 43 terminate in the mating direction at a second location. The first location can be offset from the second location in the mating direction. The termination ends 43*b* and 45*b* of the signal and ground traces 43 and 45, respectively, can be aligned with each other along the lateral direction T.

Figure 4A:
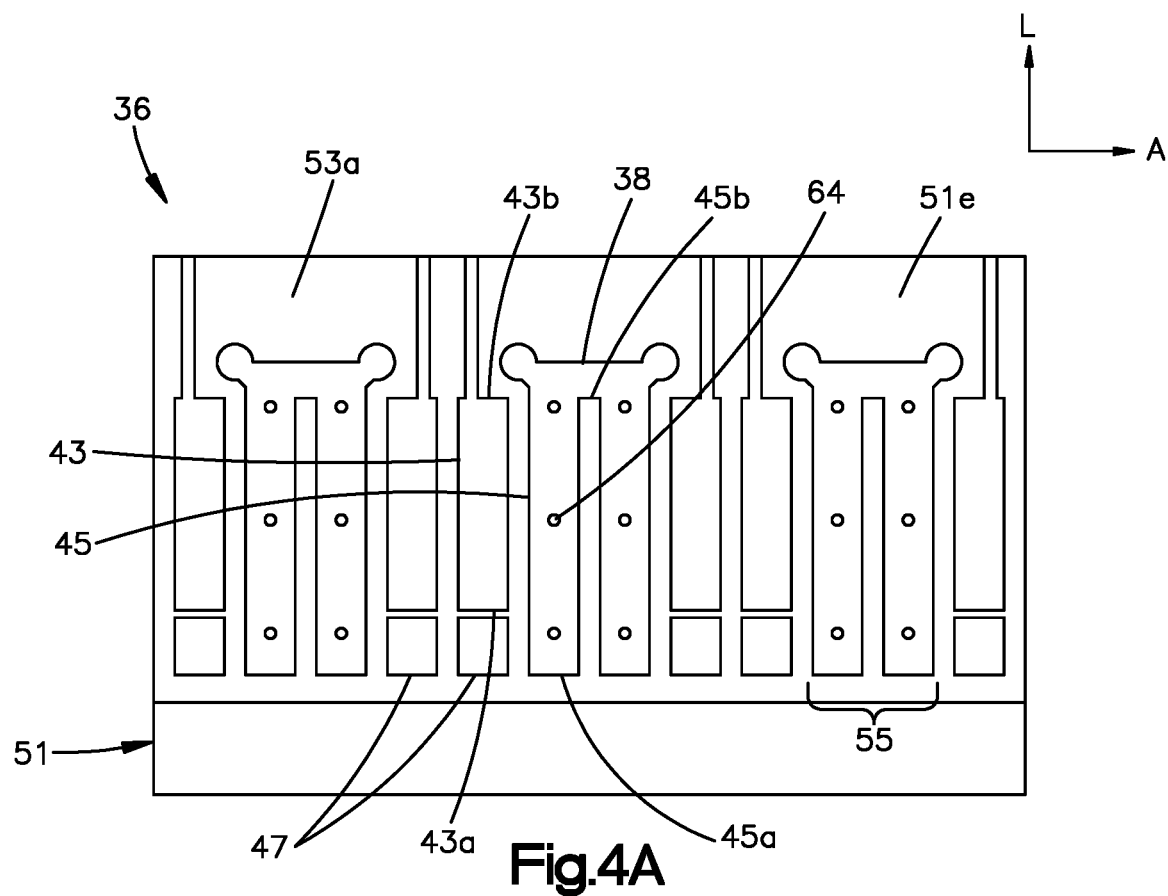
FIG. 4A is a top plan view of the substrate of the second electrical connector illustrated in FIG. 2B in accordance with an alternative embodiment.
Figure 4B:
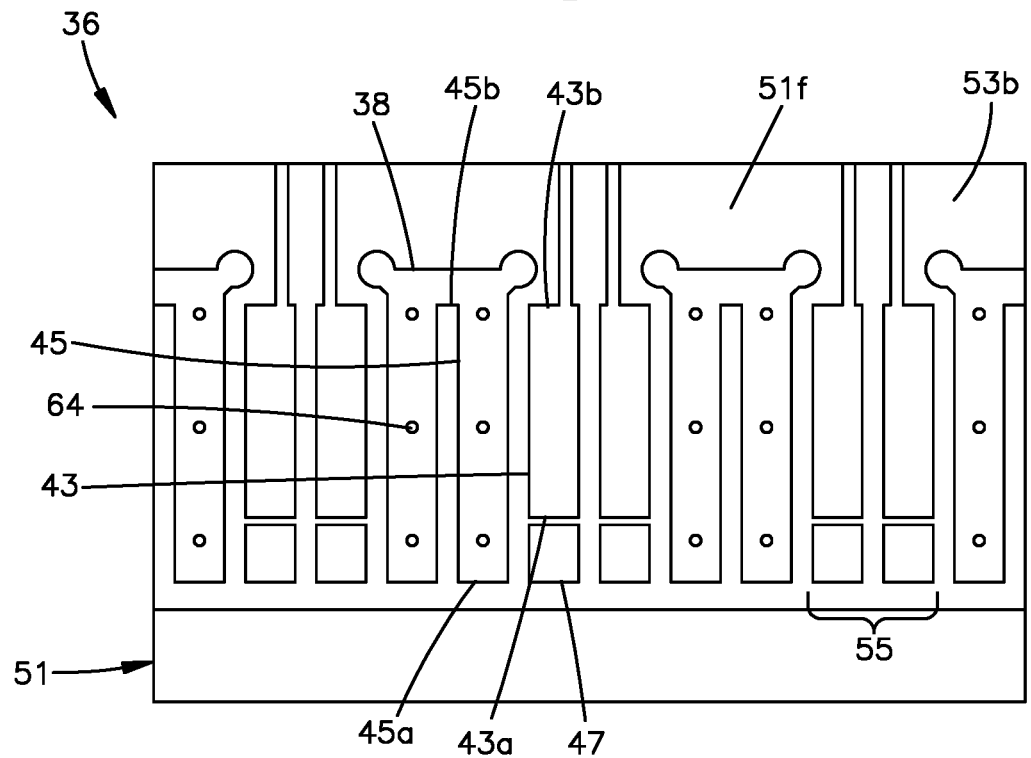
FIG. 4B is a bottom plan view of the substrate illustrated in FIG. 3A.
Figure 5A:
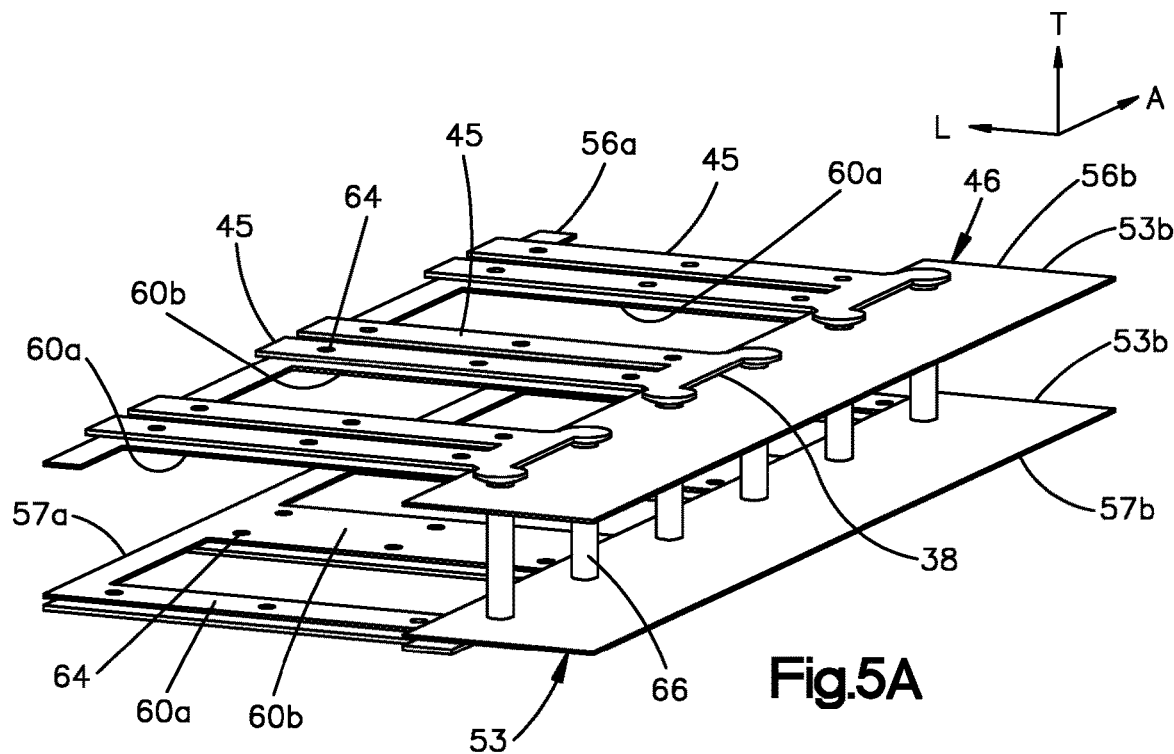
FIG. 5A is a top perspective view of a the substrate illustrated in FIG. 2A, shown with portions removed to illustrate a ground coupling assembly.
Figure 5B:
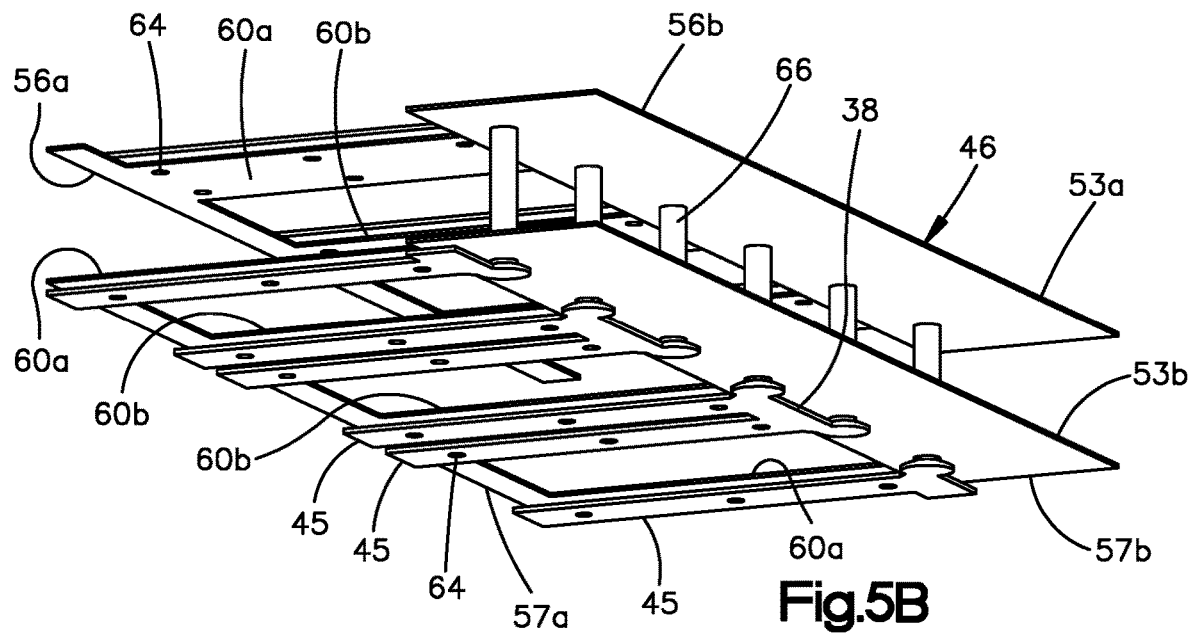
FIG. 5B is a bottom perspective view of a ground coupling assembly illustrated in FIG. 5A.
Figure 5C:
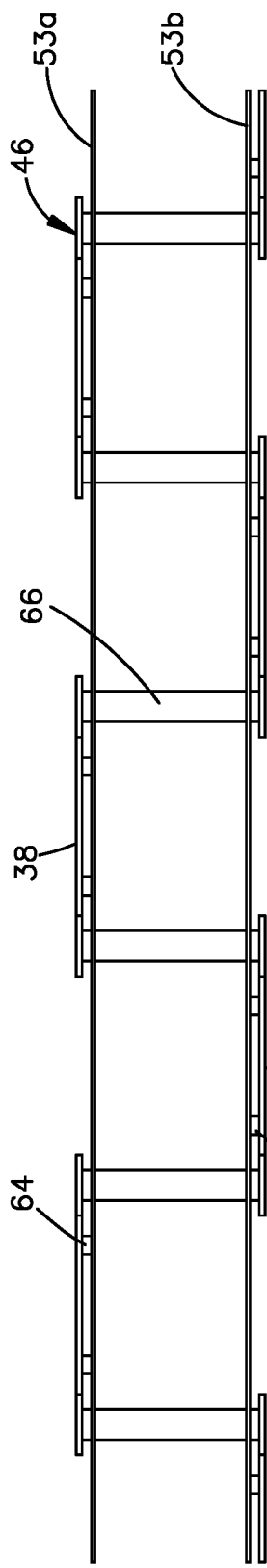
FIG. 5C is an end elevation view of the ground coupling assembly illustrated in FIG. 5A.
Figure 5D:
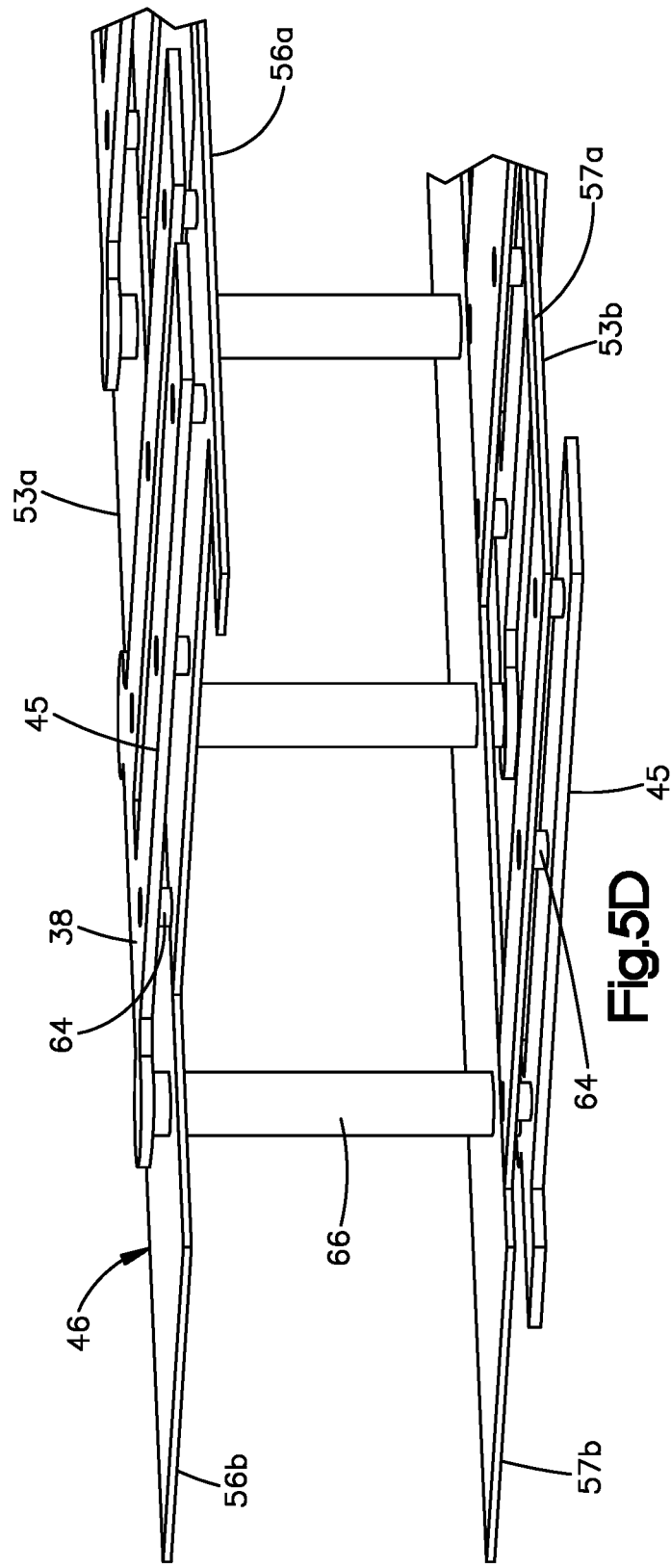
FIG. 5D is a shallow perspective view of the ground coupling assembly illustrated in FIG. 5A.

As illustrated in FIGS. 4A-4B, the substrate 36 can further include at least one lead-in pad 47 that is aligned with a respective one of the at least one signal trace 43 along the longitudinal direction L. For instance, the substrate 36 can include a plurality of lead-in pads 47 that are aligned with respective different ones of the signal trace 43 along the longitudinal direction L. The lead-in pads 47 can be disposed adjacent the mating ends 43*a* of the signal traces. For instance, the lead-in pads 47 can be spaced from the mating ends 43*a* in the mating direction. In one example, the the lead-in pads 47 can be aligned with the mating ends 43*a* in the mating direction. The lead-in pads 47 can be electrically isolated from each the signal traces 43. Thus, the lead-in pads 47 can define a wiping surface for the mating ends 32*a* of the signal contacts 37 of the first electrical connector 22 before the mating ends 32*a* of the signal contacts 37 mate with the mating ends 32*a* of the signal traces 43. The lead-in pads 47 can be electrically conductive, and can be metallic as desired.

As illustrated in FIGS. 1B-1C, when the first and second electrical connectors 22 and 24 are fully mated to each other, each substrate 36 of the second electrical connector 24 is inserted into a respective receptacle 33 of the first electrical connector 22 in the mating direction to a depth sufficient for the mating ends 43*a* of the signal traces 43 to contact the mating ends 32*a* of the electrical signal contacts 37 of the first electrical connector 22 so as to mate with the complementary electrical signal contacts 37. Similarly, when the first and second electrical connectors 22 and 24 are fully mated to each other, each substrate 36 of the second electrical connector 24 is inserted into a respective receptacle 33 of the first electrical connector 22 along the longitudinal direction L to a depth sufficient for the mating ends 45*a* of the ground traces 45 to contact the mating ends 32*a* of the electrical ground contacts 39 of the first electrical connector 22 so as to mate with the complementary electrical signal contacts 37. Thus, adjacent signal traces 43 along the lateral direction A can define differential signal pairs 55, and at least one ground trace 45 can be disposed between adjacent differential signal pairs 55. Thus, the signal traces 43 and the ground traces 45 can define the same pattern as the signal contacts 37 and ground contacts 39 of the respective first and second rows 35 that define the receptacles 33. For instance, the signal traces 43 can define a repeating S-S-G-G pattern, S-S-G pattern, G-S-S pattern, S-G-S pattern, or any other pattern as desired along the lateral direction A, wherein "S" identifies a signal trace 43 and "G" identifies a ground trace 45.

The electrical traces at the first surface 51*e* can be inline with the electrical traces at the second surface 51*f* along the transverse direction T. However, the pattern of the signal traces and ground traces at the first surface 51*e* can be offset with respect to the pattern of the signal traces and ground traces at the second surface 51*f* along the lateral direction. For instance, the electrical traces at both the first and second surfaces 51*e* and 51*f* can each include a pair of immediately adjacent ground traces 45 that are disposed between immediately adjacent pairs of signal traces 43. However, because the patterns at the first and second surfaces 51*e* and 51*f* can be offset with respect to each other in one example, the pair of immediately adjacent ground traces 45*a* of the first surface 51*e* are not aligned with the pair of immediately adjacent ground traces 45 of the second surface 51*f* along the transverse direction T. Similarly, the immediately adjacent pairs of signal traces 43 of the first surface 51*e* are not aligned with the immediately adjacent pairs of signal traces 43 at of the second surface 51*f* along the transverse direction T. Alternatively, the patterns at the first and second surfaces 51*e* and 51*f* can be identical with each other and aligned with each other, such that all signal traces and ground traces of the first surface 51*e* are aligned with all signal traces and ground traces, respectively, at the second surface 51*f* along the transverse direction T.

Adjacent pairs of ground traces 45 along the lateral direction A can further be electrically commoned together. In particular, referring now to FIGS. 2A-3E and 5A-5D, each substrate 36 can include a ground coupling assembly 46 that is configured to electrically connect at least two ground traces 45 while maintaining electrical isolation with respect to the signal traces 43. Thus, a dielectric material, such as the substrate body 51 alone or in combination with air, can separate all of the ground coupling assembly 46 from all of the signal traces 43.

The ground coupling assembly 46, and thus the substrate 36, can include a plurality of electrically conductive bridges 38 that are electrically and mechanically connected to first and second ground traces 45 of the pairs of immediately adjacent ground traces 45, respectively, that are disposed between immediately adjacent pairs of signal traces. In particular, the bridges 38 can be connected to the termination ends 45*b* of the ground traces 45. Further, the bridges 38 can be localized at the termination ends 45*b*, and not extend along the mating direction from the termination ends toward the mating ends 45*a*.

Thus, each bridge 38 can join a first one of the respective pair of ground traces 45 to a second one of the respective pair of ground traces 45. The first and second ones of the pair of ground traces 45 can define an immediately adjacent pair of ground traces. The first and second ones of the pair of ground traces 45 can be disposed between immediately adjacent pairs of signal traces 43. The bridge 38 can be connected between the first and second ones of the pair of ground traces 45 at the respective termination ends 45*b*. The bridge 38 can be disposed in a plane that is defined by the longitudinal direction L and the lateral direction A. Thus, the first and second ones of the pair of ground traces 45 can be commoned together in a plane that is defined by the longitudinal direction L and the lateral direction A. The ground commoning bridge 38 can terminate at the first and second ground traces 45 of the pair of ground traces 45 with respect to the lateral direction A. Further, in one embodiment the ground communing bridges 38 do not contact each other, and instead are spaced from each other along the lateral direction A. Thus, in one embodiment, the ground commoning bridge 38 can place the first and second ones of the pair of ground traces 45, and no other ground traces 45, in electrical communication with each other. The bridge 38 can be electrically isolated from all signal traces 43. Further, the bridge 38 can be monolithic with the first and second ones of the pair of ground traces 45. The bridge 38 can be disposed at the first surface 51e. In one example, the bridge 38 can be confined to the first surface and does not extend to a location between the first and second surfaces 51e and 51f. Thus, the bridge 38 can be in-plane with the first and second ones of the ground traces of the pair of ground traces 45, the plane being defined by the lateral direction A and the longitudinal direction L.

A first at least one bridge 38 can extend along the first surface 51e when the pair of ground traces 45 are at the first surface 51e. A second at least one bridge 38 can extend along the second surface 51f when the pair of ground traces 45 are at the second surface 51f. It should further be appreciated that the substrate can include a first at least one bridge 38 at the first surface 51e and a second at least one bridge 38 at the second surface 51f. Further, the substrate 36 can include a first plurality of bridges that each commons the first and second ones of different pairs of ground traces 45 at the first surface 51e in the manner described above. Alternatively, one or more of the bridges 38 at the first surface 51e can common ground traces 45 of more than one pair together. The substrate 36 can include a second plurality of bridges that each commons the first and second ones of different pairs of ground traces 45 at the second surface 51f in the manner described above. Alternatively, one or more of the bridges 38 at the second surface 51f can common ground traces 45 of more than one pair together. Thus, the substrate 36 can include a first plurality of bridges 38 at the first surface 51e, and a second plurality of bridges 38 at the second surface 51f.

Figure 2A:
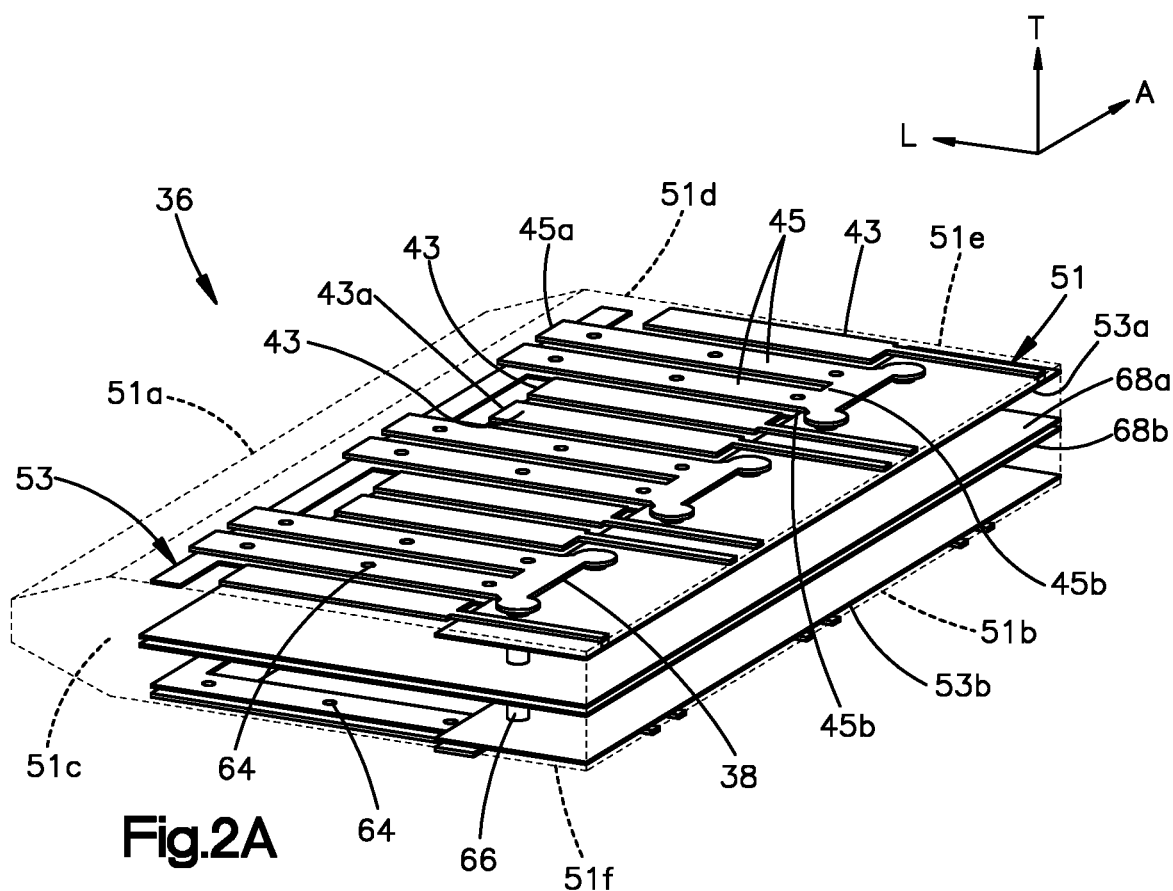
FIG. 2A is a top perspective view of the substrate of the second electrical connector illustrated in FIG. 1A, but shown with portions transparent to illustrate internal structures of the substrate.
Figure 2B:
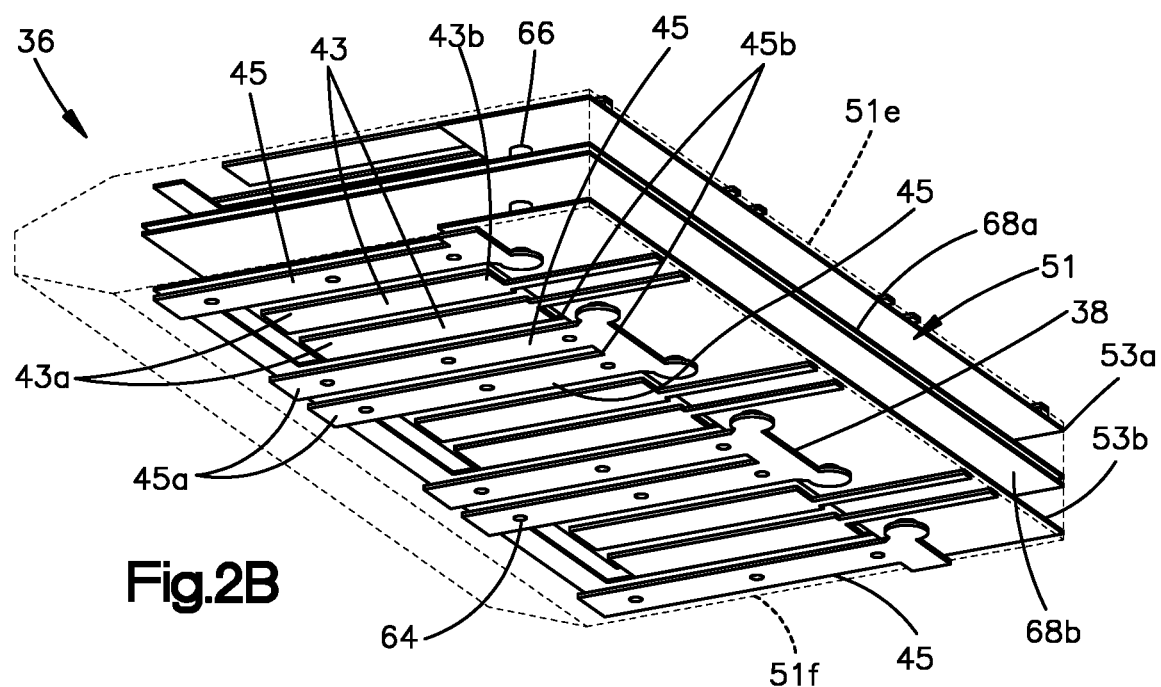
FIG. 2B is a bottom perspective view of the substrate illustrated in FIG. 2A.
Figure 3A:
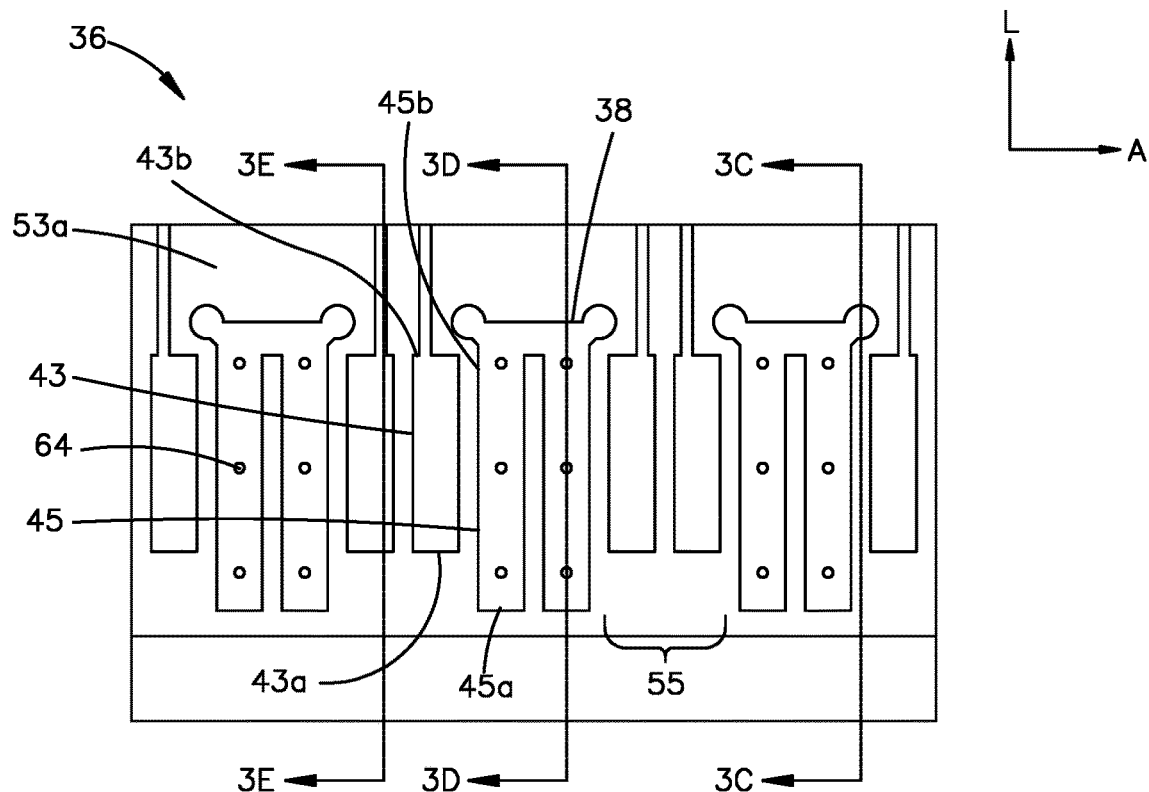
FIG. 3A is a top plan view of the substrate of the second electrical connector illustrated in FIG. 2B.
Figure 3B:
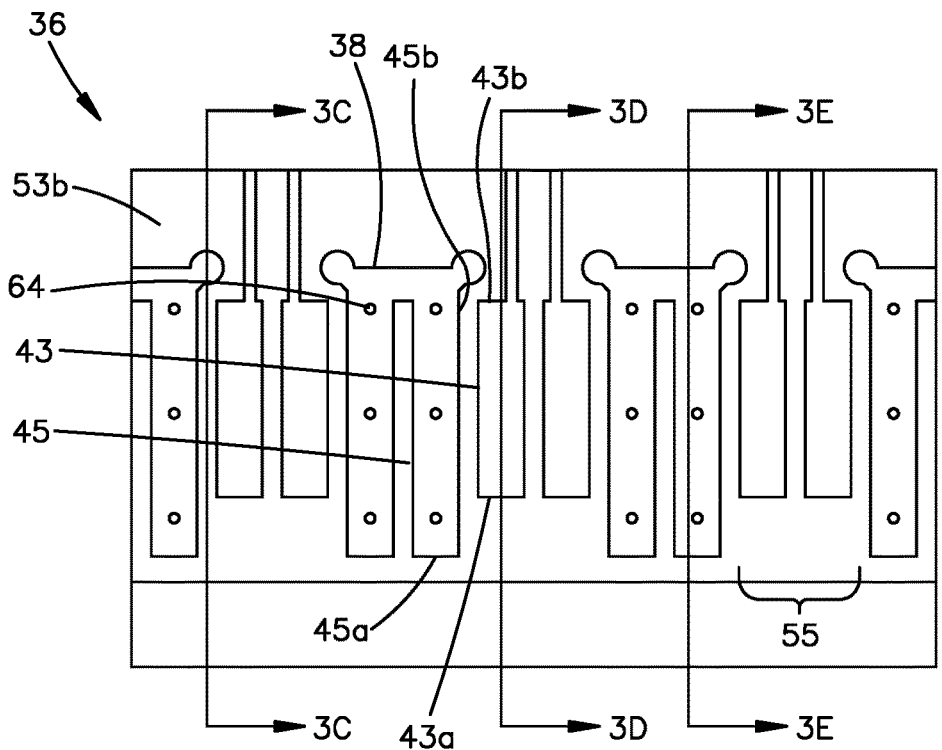
FIG. 3B is a bottom plan view of the substrate illustrated in FIG. 2B.
Figure 3C:
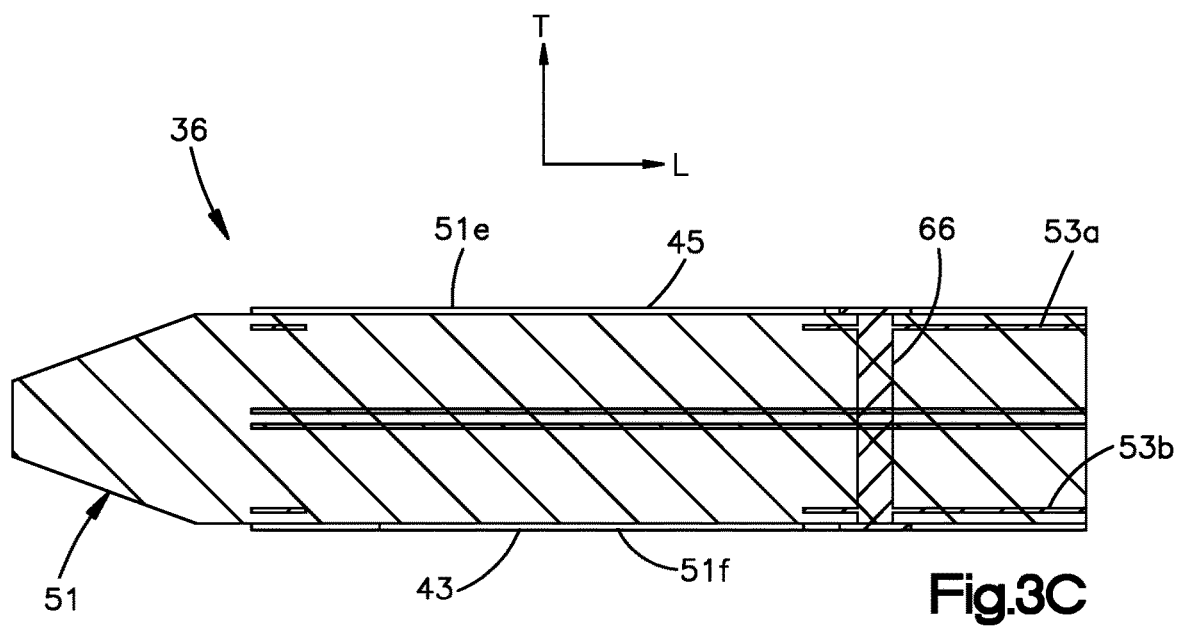
FIG. 3C is a sectional side elevation view of the substrate illustrated in FIGS. 3A and 3B, taken along line 3C-3C.
Figure 3D:
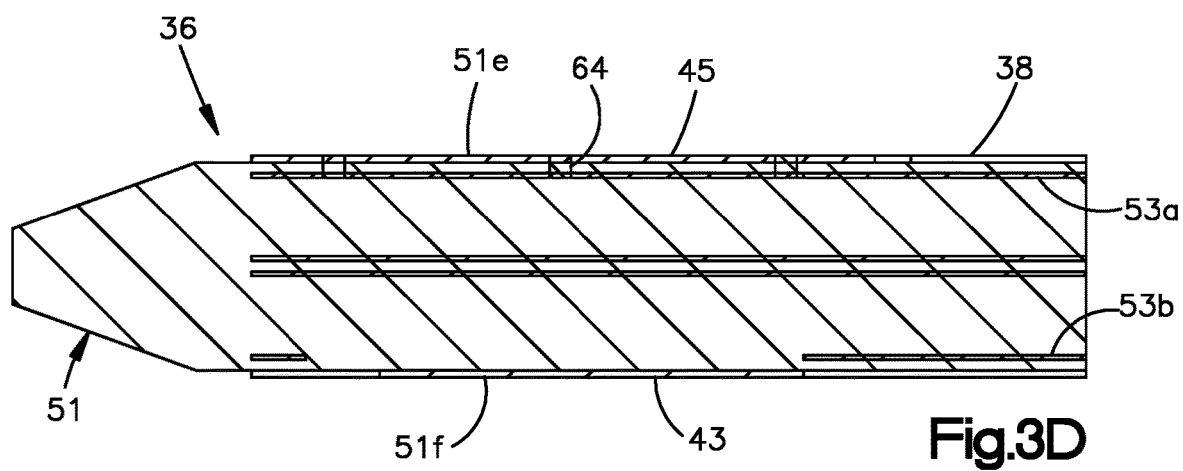
FIG. 3D is a sectional side elevation view of the substrate illustrated in FIGS. 3A and 3B, taken along line 3D-3D.
Figure 3E:
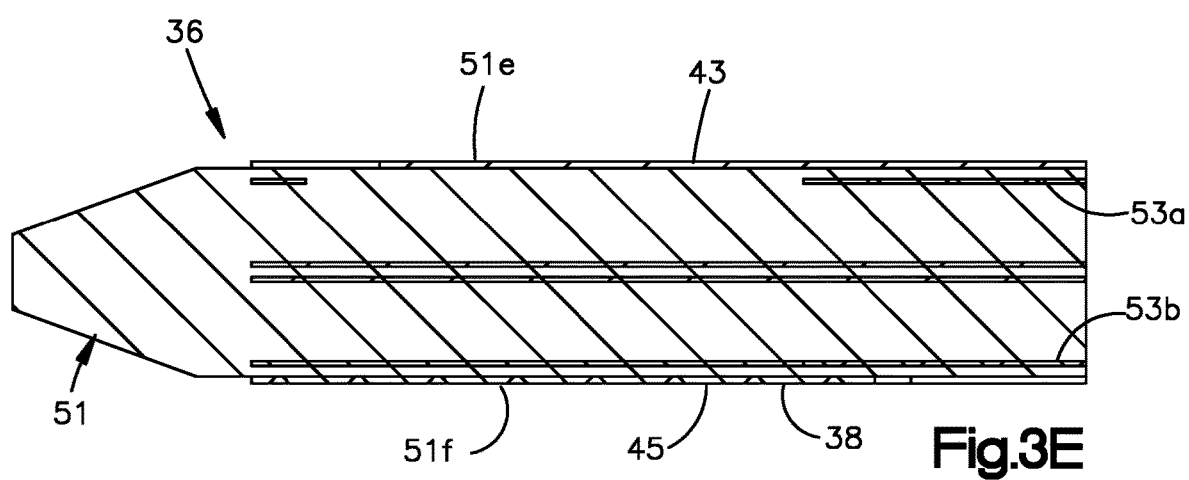
FIG. 3E is a sectional side elevation view of the substrate illustrated in FIGS. 3A and 3B, taken along line 3E-3E.

As illustrated in FIGS. 2A-2B, it is recognized that the electrical traces at the first surface 51e can be staggered with respect to the electrical traces at the second surface 51f, as described above. Accordingly, the bridges 38 at the first surface 51e can be offset with respect to the bridges 38 at the second surface 51f along the lateral direction A. For instance, the bridges 38 at the first surface 51e can be alternatingly arranged with respect to the bridges 38 at the second surface 51f along the lateral direction A.

The substrate 36 can further define a mounting interface that is configured to be mounted to a corresponding electrical component so as to establish a connection between the second electrical connector 24 and the corresponding electrical component. In particular, an electrical connection is established between the signal traces 43 and the corresponding electrical component. Thus, one or both of the first and second surfaces 51e and 51f can define the mounting interface. The corresponding electrical component can, for instance, be a cable or a plurality of cables. The cables can be optical cables in one example. In another example, the cables can be electrically conductive cables. The second electrical connector 24 and the cable can define a cable assembly that is configured to mate with the first electrical connector 22 so as to place the at least one cable in electrical communication with the first electrical connector 22, and thus to the electrical component to which the first electrical connector 22 is mounted when the first electrical connector 22 is mounted to the corresponding electrical component. While the second electrical connector 24 is described with reference to the substrate 36, it should be appreciated that the second electrical connector 24 can include any number of substrates 36 as desired. For instance, the second electrical connector 24 can include first and second substrates 36 that are configured to be inserted into respective first and second receptacles 33 of the first electrical connector 22, thereby establishing an electrical connection between each of the first and second substrates 36 and the electrical contacts 32 that define the respective first and second receptacles 33. Thus, the first and second substrates 36 can be spaced from each other along the transverse direction T. The description herein of the substrate 36 is equally applicable to both the first and second substrates 36.

The ground coupling assembly 46, and thus the substrate 36, can electrically connect at least two pairs of ground traces 45. The pairs of ground traces that are electrically connected through the ground coupling assembly can be at a common one of the first surface 51e and the second surface 51f. The ground coupling assembly 46 can further electrically connect pairs of ground traces at the common other one of the first surface 51e and the second surface 51f. In one example, the ground coupling assembly 46 can electrically connect all ground traces 45 at a common one of the first surface 51e and the second surface 51f. The ground coupling assembly 46 can further electrically connect all ground traces 45 at the common other one of the first surface 51e and the second surface 51f. The ground coupling assembly 46 can maintain the ground traces at the first surface 51e electrically isolated from the ground traces at the second surface 51f. Alternatively, if desired, the ground coupling assembly 46 can electrically couple the ground traces at the first surface 51e to the ground traces at the second surface 51f.

Referring also to FIGS. 5A-6B, the ground coupling assembly 46, and thus the substrate 36, can include at least one electrically conductive ground plate 53 that is disposed between the first surface 51e and the second surface 51f. The ground plate 53 can be made of metal. Alternatively or additionally, the ground plate can be made of an electrically lossy material. In one example, the electrically lossy material can coat the outer surfaces of the ground plate 53. The ground coupling assembly 46 can include a first ground plate 53a and a second ground plate 53b. The first ground plate 53a is electrically and mechanically connected to one or more of the ground traces 45 at the first surface 51e. The second ground plate 53b is electrically and mechanically connected to one or more of the ground traces 45 at the second surface 51f. The first ground plate 53a can be disposed between the first surface 51e and the second ground plate 53b with respect to the transverse direction T. The second ground plate 53b can be disposed between the second surface 51f and the first ground plate 53a with respect to the transverse direction T. The at least one ground plate 53 will now be described with respect to the first ground plate 53a. While the first ground plate 53a is described as associated with the electrical traces 45 at the first surface 51e, it should be appreciated that the description of the first ground plate 53a applies to the second ground plate 53b, the exception being that the second ground plate 53b is associated with the electrical traces at the second surface 51f.

As described above, the ground plate 53a is aligned with the mating end 45a of the at least one ground trace 45 at the first surface 51a along the transverse direction T. For instance, the ground plate 53a can be aligned with the mating ends 45a of a plurality of the ground traces 45 at the first surface 51e along the transverse direction T. In one example, the ground plate 53a is aligned with the mating ends of all of the ground traces 45 at the first surface 51e along the transverse direction T. Further, no portion of the ground plate 53a is aligned with the mating end 43a of the at least one signal trace 43 at the first surface 51e along the transverse direction T. In particular, no portion of the ground plate 53a is aligned with the mating ends 43a of any of the signal traces 43 at the first surface 51e along the transverse direction T. The ground plate 53a can lie in a plane that is defined by the lateral direction A and the longitudinal direction L. It should be appreciated, of course, that the ground plate 53 can further include portions that extend along the transverse direction T. Thus, the ground plate 53 is illustrated as a planar structure in one example. However, it should be appreciated that the ground plate 53a is not limited to a planar structure unless otherwise indicated.

The ground plate 53a can be a single monolithic unitary structure. Alternatively, the ground plate 53a can be made of separate components that are attached or otherwise electrically connected to each other. The ground plate 53a defines a leading plate end 56a and a trailing plate end 56b opposite the leading plate end 56a along the longitudinal direction L. The leading plate end 56a is spaced from the trailing plate end in the mating direction. The ground plate 53a can be supported by the substrate body 51, such that the ground plate 53a is aligned with the mating ends 45a of each of the ground traces 45 at the first surface 51e. For instance, the leading plate end 56a can aligned with the mating end 45a of one or more, up to all, of the one ground traces 45 at the first surface 51e along the transverse direction T. An entirety of the leading plate end 56a can be offset from an entirety of each of the signal traces 43 at the first surface 51e along a plane that includes the longitudinal direction L and the lateral direction A. For instance, at least a portion of the leading plate end 56a, such as an entirety of the leading plate end 56a, can be offset with respect to an entirety of each of the signal traces 43 at the first surface 51e in the mating direction. At least a portion of the leading plate end 56a can be aligned with at least a portion of the at least one ground trace 45 at the first surface 51e along the transverse direction T. For instance, at least a portion of the leading end 56a can be aligned with the mating ends 45a of the ground traces 45 at the first surface 51e along the transverse direction T. At least a portion of the leading plate end 56a can be aligned with the lead-in pads 47 along the transverse direction. The lead-in pads 47 can be positioned so as to be inline with the leading plate ends 56a along the lateral direction A.

The trailing plate end 56b can be aligned with at least one of the ground traces 45 at the first surface 51e along the transverse direction T. For instance, the trailing plate end 56b can be aligned with all of the ground traces 45 at the first surface 51e along the transverse direction T. The trailing plate end 56b can further be offset from each of the signal traces 43 at the first surface 51e with respect to a direction opposite the mating direction. Alternatively, the trailing plate end 56b can be aligned with a portion of the signal traces 43 at the first surface 51e along the transverse direction T. In one example, the trailing plate end 56b of the first ground plate 53a can be aligned with the termination ends 43b of the signal traces 43 of the first surface 51e along the transverse direction T. Similarly, the trailing plate end 56b of the first ground plate 53a can be aligned with the termination ends 45b of the ground traces 45 of the first surface 51e along the transverse direction T.

The leading plate end 56a can be configured as a strip that is elongate along the lateral direction A. Further, the trailing plate end 56b can be configured as a strip that is elongate along the lateral direction A, and spaced from the strip of the leading end 56a so as to define a void 59 therebetween. The strip at the trailing plate end 56b can be longer along the longitudinal direction than the strip at the leading plate end 56a. Thus, the void 59 can extend from the leading plate end 56a to the trailing plate end 56b along the longitudinal direction A. Because the leading plate end 56a is disposed adjacent the void 59 in the mating direction, the void 59 can be aligned with the mating ends 43a of each of the signal traces 43 at the first surface 51e. In one example, the void 59 can be aligned along the transverse direction T with at least half an entire length the signal traces 43 at the first surface 51e. The length of the first signal traces 43 can refer to the distance that the signal traces 43 extend along their respective major axes. In one example, the length of the signal traces 43 is along the longitudinal direction L.

Figure 6A:
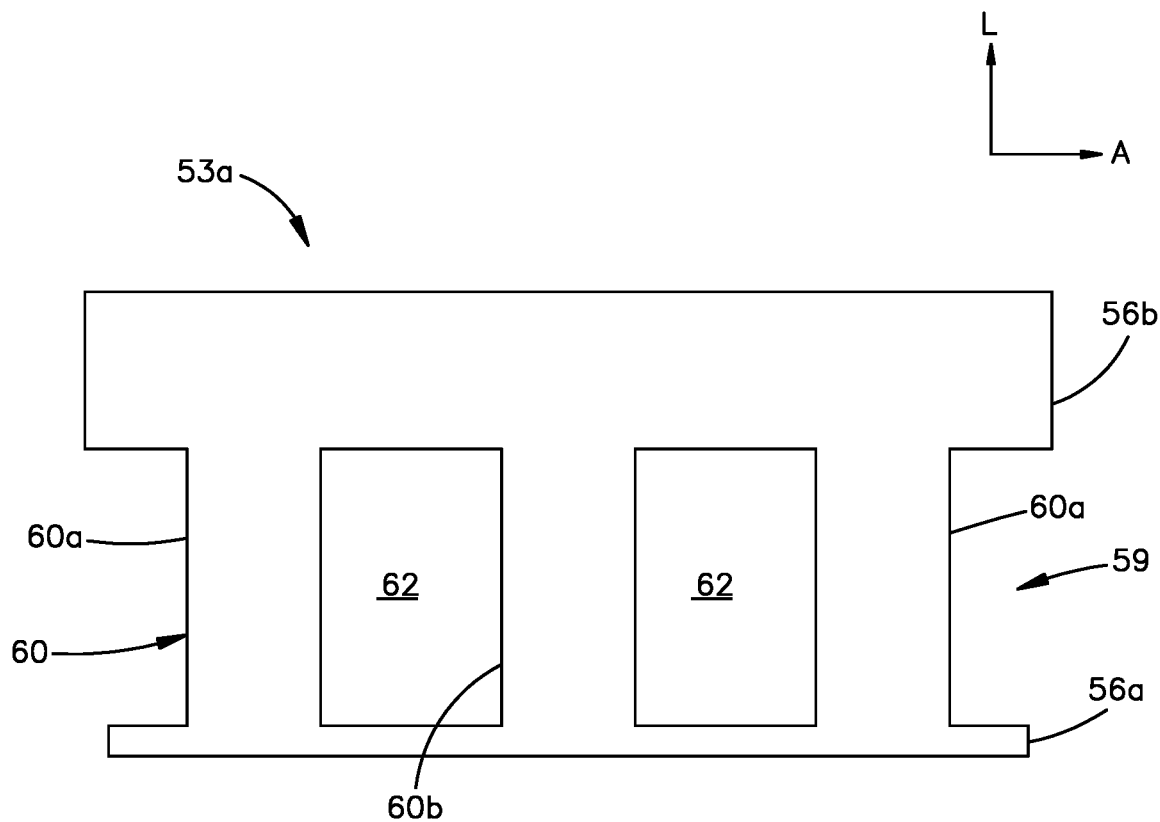
FIG. 6A is a top plan view of a first ground plate of the coupling assembly illustrated in FIG. 5A.

Referring also to FIG. 6A, the ground plate 53a can further include at least one rib 60, such as a plurality of ribs 60, that extends across the void 59 from leading plate end 56a to the trailing plate end 56b. The ribs 60 can include outermost ribs 60a and at least one inner rib 60b disposed between the outermost ribs 60a with respect to the lateral direction A. The outermost ribs 60a can define opposed outer sides of the ground plate 53a with respect to the lateral direction A. The at least one inner ribs 60b can be spaced from the outermost ribs 60a along the lateral direction A so as to define respective gaps 62 therebetween. The gaps can extend entirely through the ground plate 53a along the transverse direction. If the ground plate 53a includes a plurality of inner ribs 60b, the inner ribs 60b can be spaced from each other along the lateral direction A so as to define respective gaps 62 therebetween. Thus, the ribs 60 divide the void 59 into respective gaps 62 that are bound by the leading and trailing plate ends 56b with respect to the longitudinal direction L, and by adjacent ones of the ribs 60 with respect to the lateral direction A. Gaps 62 at least partially defined by at least one inner rib 60b can be enclosed with respect to the longitudinal direction L and the lateral direction A. Otherwise stated, gaps 62 at least partially defined by first and ones of the ribs 60 can be enclosed with respect to the longitudinal direction L and the lateral direction A. The ribs 60 can be positioned such that at least a portion of each of the gaps 62 is aligned with at least a portion of at least one of the signal traces 43 at the first surface 51e along the transverse direction T. For instance, at least a portion of each of the gaps 62 can be aligned with a portion of first and second signal traces 43 at the first surface 51e that are adjacent each other along the lateral direction A so as to define signal pairs. As described above, the signal pairs can be differential signal pairs. It should be appreciated that the signal pairs can alternatively be single ended contacts.

The ribs 60 can further be positioned such that at least a portion of at least one rib 60 is aligned with at least a portion of a corresponding at least one of the ground trace 45 at the first surface 51e along the transverse direction T. Further, an entirety of the at least one rib is offset from a respective entirety of each of the signal traces 43 of the upper surface 51e in an offset direction. In one example, the offset direction can be the lateral direction. As a result, no line oriented in the transverse direction T passes through both the at least one rib and any of the signal traces 43 at the first surface 51e.

Referring further to FIGS. 3A-5D, the ground coupling assembly 46, and thus the substrate 36, can include at least one electrically conductive microvia 64 that is connected between at least one of the ground traces 45 at the first surface 51e and the ground plate 53a. For instance, the at least one microvia 64 can be connected between at least one of the ground traces 45 at the first surface 51e and a corresponding one of the ribs 60a. The at least one of the ground traces 45 and the corresponding one of the ribs 60a can be aligned with each other along the transverse direction T. In one example, the substrate 36 can include a plurality of microvias 64 that are connected between the ground plate 53a and each of the ground traces 45 at the first surface 51e.

For instance, the microvias 64 can be connected between respective ones of the ribs 60*a* and the ground traces 45 at the first surface 51*e*. The respective ground traces 45 and the corresponding ones of the ribs 60*a* to which the microvias 64 are connected can be aligned with each other along the transverse direction T. In one example, each microvia 64 can terminate with respect to the transverse direction T at both the ground plate 53*a* and the at least one ground trace 45. Alternatively, one or more of the microvias 64 can be alternatively configured as buried vias that extend from the ground trace 45 of one of the first and second surfaces, through the respective ground plate (e.g., ground plate 53*a* or 53*b*), and can terminate at another ground plate disposed between the opposed surface and the respective ground plate.

The microvias 64 can be arranged in at least one group of microvias 64. The microvias 64 of the group of microvias are spaced from each other along the longitudinal direction L. Thus the microvias 64 of the group of microvias can be connected to a common one of the ribs 60*a*, and a common one of the ground traces 45 at the first surface 51*e*. In one example, the microvias 64 of the group of microvias are aligned with each other along the longitudinal direction. In one example, all of the microvias are offset from the bridge 38 in the mating direction. The microvias 64 of each group of microvias can be aligned with each other along the longitudinal direction L.

As illustrated, the at least one group of microvias can include a plurality of groups of microvias. Each group of microvias can extend from the ground plate 53*a* to a corresponding different one of the ground traces 45 at the first surface 51*e*. In particular, each group of microvias can extend from a common one of the ground ribs 60*a* to a common aligned corresponding one of the ground traces 45 at the first surface 51*e*. Thus, the groups of microvias can be spaced from each other along the lateral direction A. The corresponding one of the ground traces 45 at the first surface 51*e* can be aligned with the common one of the ribs 60*a* along the transverse direction T. Thus, first and second groups of microvias can extend from a corresponding one of the ribs 60*a* to the aligned first and second ground traces 43, respectively, at the first surface 51*e*. The first and second groups of microvias can therefore define a pair of groups of microvias that are electrically commoned together through the common one of the ribs 60*a*. Accordingly, the first and second adjacent traces 45 contacts that define a pair of ground traces 45 can be electrically commoned together through the first and second groups of microvias and the common one of the ribs 60*a*. Thus, it should be appreciated that the first and second adjacent ground traces 45 contacts that define a pair of ground traces 45 can be electrically commoned together through 1) the first and second groups of microvias and the common one of the ribs 60*a*, and 2) the bridge 38. The bridge 38 commons the first and second adjacent ground traces 45 in the lateral direction A in-plane with the first and second adjacent ground traces 45. The first and second groups of microvias 64 and the common one of the ribs 60 common the first and second adjacent ground traces in the lateral direction in a plane that is offset toward the opposed second surface 51*f* with respect to the plane that includes the first and second adjacent ground traces 45 at the first surface 51*e*.

As described above, the description of the first ground plate 53*a* is equally applicable to the second ground plate 53*b*. Thus, referring also to FIG. 6B, the second ground plate 53*b* is aligned with the mating end 45*a* of the at least one ground trace 45 at the first surface 51*e* along the transverse direction T. For instance, the ground plate 53*b* can be aligned with the mating ends 45*a* of a plurality of the ground traces 45 at the first surface 51*e* along the transverse direction T. In one example, the ground plate 53*b* is aligned with the mating ends of all of the ground traces 45 at the second surface 51*f* along the transverse direction T. Further, no portion of the ground plate 53*b* is aligned with the mating end 43*a* of the at least one signal trace 43 at the second surface 51*f* along the transverse direction T. In particular, no portion of the ground plate 53*b* is aligned with the mating ends 43*a* of any of the signal traces 43 at the second surface 51*f* along the transverse direction T. The ground plate 53*b* can lie in a plane that is defined by the lateral direction A and the longitudinal direction L. It should be appreciated, of course, that the ground plate 53 can further include portions that extend along the transverse direction T. Thus, the ground plate 53 is illustrated as a planar structure in one example. However, it should be appreciated that the ground plate 53*b* is not limited to a planar structure unless otherwise indicated.

The ground plate 53*b* can be a single monolithic unitary structure. Alternatively, the ground plate 53*b* can be made of separate components that are attached to each other. The ground plate 53*b* defines a leading plate end 57*a* and a trailing plate end 57*b* opposite the leading plate end 57*a* along the longitudinal direction L. The leading plate end 57*a* is spaced from the trailing plate end in the mating direction. The ground plate 53*b* can be supported by the substrate body 51, such that the ground plate 53*b* is aligned with the mating ends 45*a* of each of the ground traces 45 at the second surface 51*f*. For instance, the leading plate end 57*a* can aligned with the mating end 45*a* of one or more, up to all, of the one ground traces 45 at the second surface 51*f* along the transverse direction T. An entirety of the leading plate end 57*a* can be offset from an entirety of each of the signal traces 43 at the second surface 51*f* along a plane that includes the longitudinal direction L and the lateral direction A. For instance, at least a portion of the leading plate end 57*a*, such as an entirety of the leading plate end 57*a*, can be offset with respect to an entirety of each of the signal traces 43 at the second surface 51*f* in the mating direction. At least a portion of the leading plate end 57*a* can be aligned with at least a portion of the at least one ground trace 45 at the second surface 51*f* along the transverse direction T. For instance, at least a portion of the leading plate end 57*a* can be aligned with the mating ends 45*a* of the ground traces 45 at the second surface 51*f* along the transverse direction T. At least a portion of the leading plate end 57*a* can be aligned with the lead-in pads 47 along the transverse direction. The lead-in pads 47 can be positioned so as to be inline with the leading plate ends 57*a* along the lateral direction A.

The trailing plate end 57*b* can be aligned with at least one of the ground traces 45 at the second surface 51*f* along the transverse direction T. For instance, the trailing plate end 57*b* can be aligned with all of the ground traces 45 at the second surface 51*f* along the transverse direction T. The trailing plate end 57*b* can further be aligned with each of the signal traces 43 at the second surface 51*f* along the transverse direction T. In one example, the trailing plate end 57*b* of the second ground plate 53*b* can be aligned with the termination ends 43*b* of the signal traces 43 of the second surface 51*f* along the transverse direction T. Similarly, the trailing plate end 57*b* of the second ground plate 53*b* can be aligned with the termination ends 45*b* of the ground traces 45 of the second surface 51*f* along the transverse direction T.

The leading plate end 57*a* can be configured as a strip that is elongate along the lateral direction A. Further, the trailing plate end 57*b* can be configured as a strip that is elongate along the lateral direction A, and spaced from the strip of the leading plate end 57*a* so as to define a void 59 therebetween. The strip at the trailing plate end 57*b* can be longer along the longitudinal direction L than the strip at the leading plate end 57*a*. Thus, the void 59 can extend from the leading plate end 57*a* to the trailing plate end 57*b* along the longitudinal direction A. Because the leading plate end 57*a* is disposed adjacent the void 59 in the mating direction, the void 59 can be aligned with the mating ends 43*a* of each of the signal traces 43 at the second surface 51*f* In one example, the void 59 can be aligned along the transverse direction T with at least half an entire length the signal traces 43 at the second surface 51*f*. The length of the first signal traces 43 can refer to the distance that the signal traces 43 extend along their respective major axes. In one example, the length of the signal traces 43 is along the longitudinal direction L.

Figure 6B:
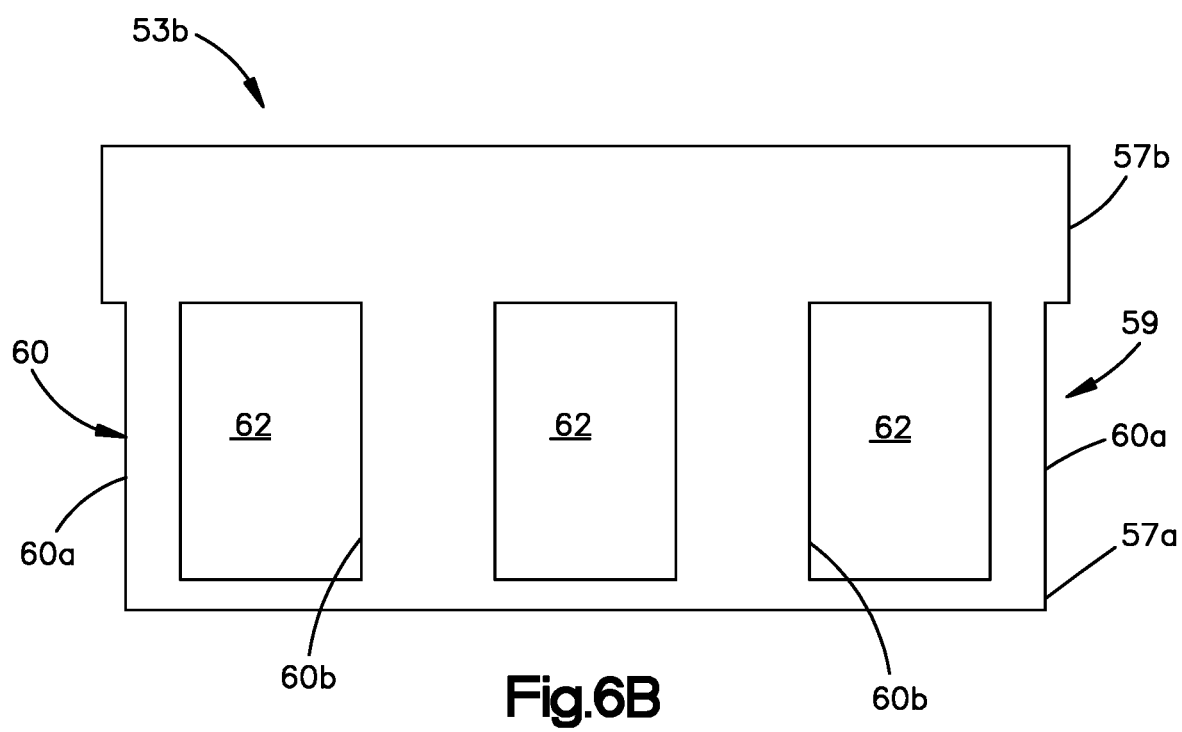
FIG. 6B is a bottom plan view of a second ground plate of the coupling assembly illustrated in FIG. 4A.

Referring also to FIG. 6B, the ground plate 53*b* can further include at least one rib 60, such as a plurality of ribs 60, that extends across the void 59 from leading plate end 57*a* to the trailing plate end 57*b*. The ribs 60 can include outermost ribs 60*a* and at least one inner rib 60*b* disposed between the outermost ribs 60*a* with respect to the lateral direction A. The outermost ribs 60*a* can define opposed outer sides of the ground plate 53*a* with respect to the lateral direction A. The at least one inner ribs 60*b* can be spaced from the outermost ribs 60*a* along the lateral direction A so as to define respective gaps 62 therebetween. The gaps 62 can extend entirely through the ground plate 53*a* along the transverse direction T. If the ground plate 53*a* includes a plurality of inner ribs 60*b*, the inner ribs 60*b* can be spaced from each other along the lateral direction A so as to define respective gaps 62 therebetween. Thus, the ribs 60 divide the void 59 into respective gaps 62 that are bound by the leading and trailing plate ends 57*b* with respect to the longitudinal direction L, and by adjacent ones of the ribs 60 with respect to the lateral direction A. Gaps 62 at least partially defined by at least one inner rib 60*b* can be enclosed with respect to the longitudinal direction L and the lateral direction A. Otherwise stated, gaps 62 at least partially defined by first and ones of the ribs 60 can be enclosed with respect to the longitudinal direction L and the lateral direction A. The ribs 60 can be positioned such that at least a portion of each of the gaps 62 is aligned with at least a portion of at least one of the signal traces 43 at the first surface 51*e* along the transverse direction T. For instance, at least a portion of each of the gaps 62 can be aligned with a portion of first and second signal traces 43 at the second surface 51*f* that are adjacent each other along the lateral direction A so as to define signal pairs. As described above, the signal pairs can be differential signal pairs. It should be appreciated that the signal pairs can alternatively be single ended contacts.

The ribs 60 can further be positioned such that at least a portion of at least one rib 60 is aligned with at least a portion of a corresponding at least one of the ground trace 45 at the second surface 51*f* along the transverse direction T. Further, an entirety of the at least one rib is offset from a respective entirety of each of the signal traces 43 of the upper surface 51*e* in an offset direction. In one example, the offset direction can be the lateral direction. As a result, no line oriented in the transverse direction T passes through both the at least one rib and any of the signal traces 43 at the second surface 51*f*.

The substrate 36 can include at least one electrically conductive microvia 64 that is connected between at least one of the ground traces 45 at the second surface 51*f* and the ground plate 53*b*. For instance, the at least one microvia 64 can be connected between at least one of the ground traces 45 at the second surface 51*f* and a corresponding one of the ribs 60*a*. The at least one of the ground traces 45 and the corresponding one of the ribs 60*a* can be aligned with each other along the transverse direction T. In one example, the substrate 36 can include a plurality of microvias 64 that are connected between the ground plate 53*b* and each of the ground traces 45 at the second surface 51*f*. For instance, the microvias 64 can be connected between respective ones of the ribs 60*a* and the ground traces 45 at the second surface 51*f*. The respective ground traces 45 and the corresponding ones of the ribs 60*a* to which the microvias 64 are connected can be aligned with each other along the transverse direction T. In one example, each microvia 64 can terminate with respect to the transverse direction T at both the ground plate 53*b* and the at least one ground trace 45. The ribs 60 of the second ground plate 53*b* can be offset with respect to the ribs 60 of the first ground plate 53*a* along the lateral direction A. For instance, the ribs 60 of the second ground plate 53*b* can be alternatingly arranged with respect to the ribs 60 of the first ground plate 53*a* along the lateral direction A. Thus, in one example, the only vias disposed forward of the signal traces 43 are microvias, or alternatively or additionally buried vias if desired.

The microvias 64 can be arranged in at least one group of microvias 64. The microvias 64 of the group of microvias are spaced from each other along the longitudinal direction L. Thus the microvias 64 of the group of microvias can be connected to a common one of the ribs 60*a*, and a common one of the ground traces 45 at the second surface 51*f*. In one example, the microvias 64 of the group of microvias are aligned with each other along the longitudinal direction. In one example, all of the microvias are offset from the bridge 38 in the mating direction. The microvias 64 of each group of microvias can be aligned with each other along the longitudinal direction L.

As illustrated, the at least one group of microvias can include a plurality of groups of microvias. Each group of microvias can extend from the ground plate 53*b* to a corresponding different one of the ground traces 45 at the second surface 51*f*. In particular, each group of microvias can extend from a common one of the ribs 60*a* to a common aligned corresponding one of the ground traces 45 at the second surface 51*f*. Thus, the groups of microvias can be spaced from each other along the lateral direction A. The corresponding one of the ground traces 45 at the second surface 51*f* can be aligned with the common one of the ribs 60*a* along the transverse direction T. Thus, first and second groups of microvias can extend from a corresponding one of the ribs 60*a* to the aligned first and second ground traces 43, respectively, at the second surface 51*f*. The first and second groups of microvias can therefore define a pair of groups of microvias that are electrically commoned together through the common one of the ribs 60*a*. Accordingly, the first and second adjacent traces 45 contacts that define a pair of ground traces 45 can be electrically commoned together through the first and second groups of microvias and the common one of the ribs 60*a*. Thus, it should be appreciated that the first and second adjacent ground traces 45 contacts that define a pair of ground traces 45 can be electrically commoned together through 1) the first and second groups of microvias and the common one of the ribs 60*a*, and 2) the bridge 38. The bridge 38 commons the first and second adjacent ground traces 45 at the second surface 51*f* in the lateral direction A in-plane with the first and second adjacent ground traces 45. The first and second groups of microvias 64 and the common one of the ribs 60 common the first and second adjacent ground traces in the lateral direction in a plane that is offset toward the opposed first surface 51e with respect to the plane that includes the first and second adjacent ground traces 45 at the second surface 51f.

With continuing reference to FIGS. 3A-3E and 5A-5D, the ground coupling assembly 46, and thus the substrate 36, can further include at least one electrically conductive via 66 that extends from a corresponding one of the at least one ground trace 45 at the first surface 51e to the second ground plate 53b. For instance, the substrate 36 can include a plurality of vias 66 that are spaced from each other along the lateral direction A. In one example, the vias 66 can be aligned with each other along the lateral direction A. The vias 66 can be aligned with the trailing plate ends 56b and 57b of the first and second plates 53 and 53b along the transverse direction T. The vias 66 can be oriented along the transverse direction T. In one example, all of the vias are disposed rearward of the signal traces 43. Thus, in this example, the only vias not disposed rearward of the signal traces are microvias, or alternatively or additionally buried vias if desired.

The electrically conductive vias 66 can each extend from a respective one of the pairs of ground traces 45 at the first surface 51e, and extend to both the first ground plate 53a and the second ground plate 53b, and to an aligned one of the ground traces 45 at the second surface 51f. In particular, the via 66 can extend from the bridge 38 to the first ground plate 53a, and from the first ground plate 53a to the second ground plate 53b, and further from the second ground plate 53b to an aligned one of the bridges 38 at the second surface 51f. In one example, the substrate 36 can include vias 66 that extend from each opposed side of each bridge 38 that is aligned with a corresponding ground trace 45 along the longitudinal direction L. Thus, the electrically conductive vias 66 that extend from the ground traces 45 at the first surface 51e can place the corresponding ground traces 45, the first ground plate 53a, and the second ground plate 53b in electrical communication with each other. Similarly, the electrically conductive vias 66 can each extend from a respective one of the pairs of ground traces 45 at the second surface 51f, and extend to both the second ground plate 53b and the first ground plate 53a, and an aligned one of the ground traces 45 at the first surface 51e. In particular, the vias 66 can extend from the bridge 38 at the second surface 51f to the first ground plate 53a, and from the first ground plate 53a to the second ground plate 53b. Thus, the electrically conductive vias 66 that extend from the ground traces 45 at the second surface 51f can place the corresponding ground traces 45, the first ground plate 53a, and the second ground plate 53b in electrical communication with each other. In one example, all microvias 64 can be offset with respect to all of the vias 66 in the mating direction. Similarly, all of the vias 66 can be offset with respect to all of the microvias 64 in a direction opposite the mating direction.

As illustrated in FIGS. 3A-3E (not shown in FIGS. 5A-5D for purposes of clarity), the coupling assembly 46, and thus the substrate 36, can further include at least one inner ground plate 68 that is disposed between the first and second ground plates 53a and 53b along the transverse direction T. Thus, the first and second ground plates 53a and 53b can be referred to as outer ground plates with respect to the transverse direction T. The at least one inner ground plate can include first and second inner ground plates 68a and 68b, respectively. The first inner ground plate 68a can be disposed between the second inner ground plate 68b and the first surface 51e with respect to the transverse direction T. The second inner ground plate 68b can be disposed between the first inner ground plate 68b and the second surface 51f with respect to the transverse direction T.

At least a portion of the first inner ground plate 68a can be aligned with respective portions of at least one or more, up to all, of the signal traces 43 and ground traces 45 at the first surface 51e. For instance, the first inner ground plate 68a can span all of the signal and ground traces 45 at the first surface 51e with respect to the lateral direction A. The first inner ground plate 68a can span majorities or entireties of all of the signal and ground traces 45 at the first surface 51e with respect to the longitudinal direction L. At least a portion of the second inner ground plate 68b can be aligned with respective portions of at least one or more, up to all, of the signal traces 43 and ground traces 45 at the second surface 51f. For instance, the second inner ground plate 68b can span all of the signal and ground traces 45 at the second surface 51f with respect to the lateral direction A. The second inner ground plate 68b can span majorities or entireties of all of the signal and ground traces 45 at the second surface 51f with respect to the longitudinal direction L. The inner ground plates 68a and 68b can each be continuous and uninterrupted along the lateral direction A and the longitudinal direction L. Alternatively, the inner ground plates 68a and 68b can define one or more through holes as desired.

The electrically conductive vias 66 that extend from the ground traces 45 at the first surface 51e can extend from the ground traces 45, to the first ground plate 53a, to the first inner ground plate 68a, to the second inner ground plate 68b, to the second ground plate 53b, and to an aligned one of the bridges 38 at the second surface 51f. Thus, the electrically conductive vias 66 that extend from the ground traces 45 at the first surface 51e can place one or more up to all of the corresponding ground traces 45, the first ground plate 53a, the first inner ground plate 68a, the second inner ground plate 68b, the second ground plate 53b, and the ground traces 45 at the second surface 51f in electrical communication with each other. Similarly, the electrically conductive vias 66 that extend from the ground traces 45 at the second surface 51f can extend from the ground traces 45, to the second ground plate 53b, to the second inner ground plate 68b, to the first inner ground plate 68, to the first ground plate 53a, and to the ground traces 45 at the first surface 51e. Thus, the electrically conductive vias 66 that extend from the ground traces 45 at the second surface 51f can place one or more up to all of the corresponding ground traces 45, the second ground plate 53b, the second inner ground plate 68b, the first inner ground plate 68a, the first ground plate 53a, and the ground traces 45 at the first surface 51e in electrical communication with each other. In particular, the electrically conductive vias can contact the trailing plate ends 56b and 57b of the first and second ground plates 53a and 53b, respectively.

It is recognizes that the vias 66 place the bridges 38 of the first surface 51e in electrical communication with the bridges 38 of the second surface 51f. Thus, the vias 66 place the ground traces 45 of the first surface 51e in electrical communication with the ground traces 45 of the second surface 51f. Further, the vias 66 place the bridges 38 of the first surface 51e in electrical communication with each other. Thus, the vias 66 place the ground traces 45 of the first surface 51e in electrical communication with each other. Further, the vias 66 place the bridges 38 of the second surface 51f in electrical communication with each other. Thus, the vias 66 place the ground traces 45 of the second surface 51 in electrical communication with each other.

Figure 7:
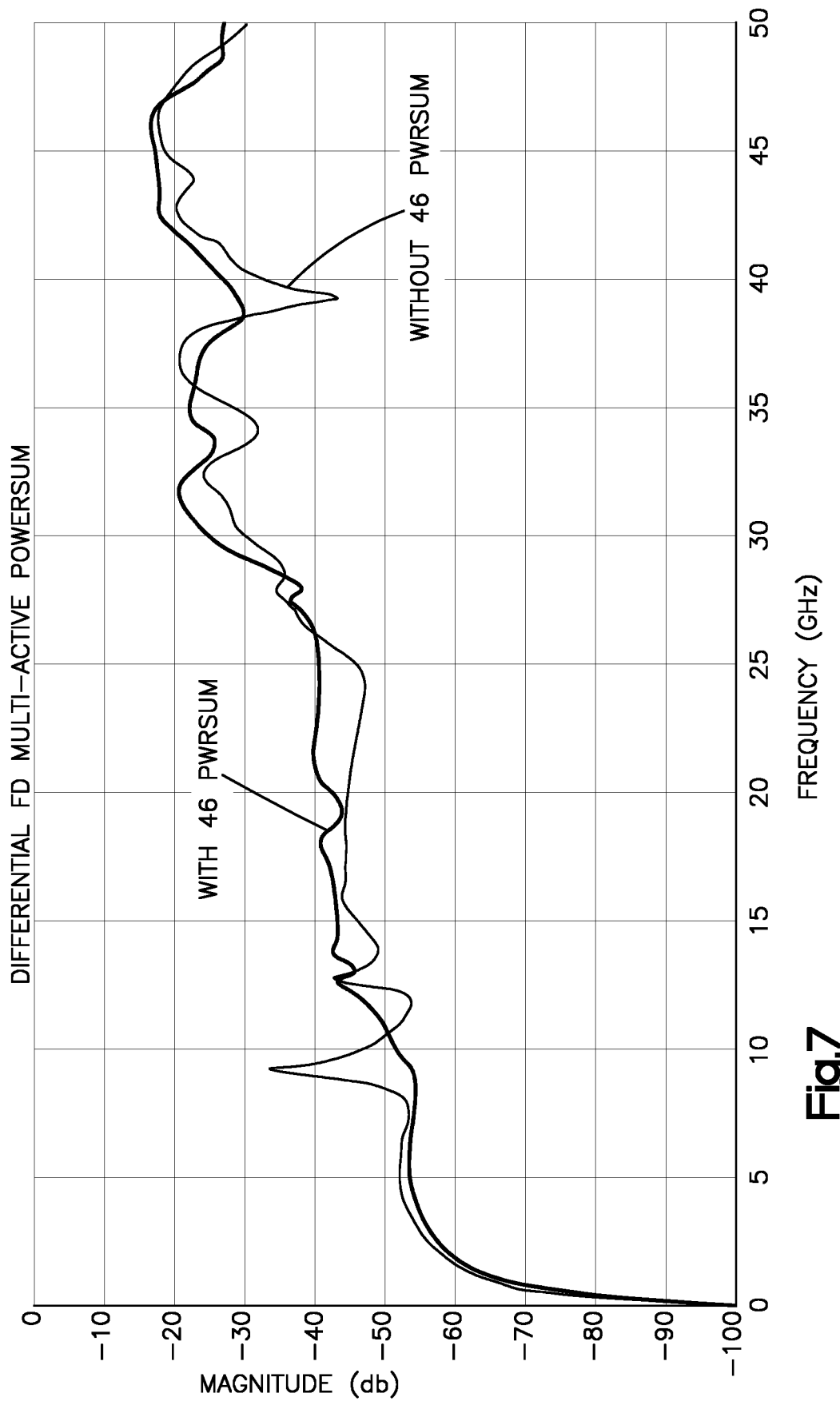
FIG. 7 is a chart illustrating performance data of the second electrical connector compared to an electrical connector without the ground coupling assembly.

Without being bound by theory, it is believed that electrically commoning ground traces 45 at the bridges 38, and commoning the bridges 38 at the first and second surfaces 51e and 51f to each other can make the ground more robust and effectively shortens the electrical length of the ground, thereby shifting the electrical resonance of the ground contacts to higher frequencies. For instance, as illustrated at FIG. 7, the present disclosure can shift resonant frequencies at −40 dB from approximately 8 GHz to approximately 27 GHz. This improves both insertion loss and crosstalk. The ground coupling assembly 46 can thus achieve various performance advantages for the first and second electrical connectors 24 and the connector assembly 20, such as shifting the frequency at which resonance occurs, which can refer to a frequency at which significant unwanted signal degradation occurs. Shifting significant unwanted insertion loss resonances to higher frequencies can allow for more usable bandwidth in the connector assembly 20. The data transfer rate can be increased until a resonance frequency is encountered. At the resonance frequency, the crosstalk becomes too high (i.e., above six percent for time domain or a comparable time domain measurement) or the insertion loss to crosstalk ratio becomes too low and the connector no longer functions acceptably (out of specification or loss of data). Furthermore, it is believed that shifting the above-described resonant frequencies can be achieved without substantially altering the impedance profile of the connector.

It should be noted that the illustrations and discussions of the embodiments shown in the figures are for exemplary purposes only, and should not be construed limiting the disclosure. One skilled in the art will appreciate that the present disclosure contemplates various embodiments. Additionally, it should be understood that the concepts described above with the above-described embodiments may be employed alone or in combination with any of the other embodiments described above. It should be further appreciated that the various alternative embodiments described above with respect to one illustrated embodiment can apply to all embodiments as described herein, unless otherwise indicated.

What is claimed:

1. A substrate comprising:
a body defining:
a leading end and a trailing end opposite the leading end along a longitudinal direction, the leading end configured to be inserted into a receptacle of a complementary electrical connector in a mating direction that is oriented along the longitudinal direction,
first and second sides spaced from each other along a lateral direction that is substantially perpendicular to the longitudinal direction, and
first and second outer surfaces that are spaced from each other along a transverse direction that is substantially perpendicular to each of the longitudinal direction and the lateral direction;
a plurality of electrical signal traces at the first outer surface and each defining a mating end, the electrical signal traces arranged in pairs of immediately adjacent signal traces along the lateral direction
a plurality of electrical ground traces at the first outer surface and defining mating ends and termination ends opposite the mating ends along the longitudinal direction, the electrical ground traces defining pairs of immediately adjacent ground traces along the lateral direction, wherein respective pairs of ground traces are disposed between pairs of immediately adjacent signal traces; and
a plurality of electrically conductive bridges that are electrically and mechanically connected to first and second ground traces of respective pairs of immediately adjacent ground traces that are disposed between immediately adjacent pairs of signal traces, thereby electrically commoning the first and second ground traces of each of the respective pairs of immediately adjacent ground traces in a plane that is defined by the longitudinal direction and the lateral direction, wherein the electrically conductive bridges are disposed at the first outer surface, the electrically conductive bridges are isolated from all signal traces, and the electrically conductive bridges do not contact each other;
an electrically conductive ground plate disposed between the first outer surface and the second outer surface, wherein the electrically conductive ground plate is aligned with the mating ends of the ground traces along the transverse direction; and
electrically conductive vias that extend from respective ones of the bridges to the electrically conductive ground plate.

2. The substrate as recited in claim 1, wherein the ground traces extend in a straight linear direction.

3. The substrate as recited in claim 2, wherein the bridges are monolithic with the first and second ground traces of the respective pairs of immediately adjacent ground traces.

4. The substrate as recited in claim 3, wherein the first and second ground traces are electrically connected to the ground plate at a location offset from the electrically conductive bridges in the mating direction.

5. The substrate as recited in claim 3, wherein each of the electrically conductive bridges extends along the lateral direction from the first ground trace to the second ground trace of the respective pair of ground traces.

6. The substrate as recited in claim 3, wherein respective entireties of the electrically conductive bridges are in-plane with the respective pairs of ground traces.

7. The substrate as recited in claim 3, further comprising a plurality of microvias that are connected between the ground plate and aligned ones of the ground traces of the first outer surface along the transverse direction.

8. The substrate as recited in claim 3, further comprising:
a plurality of electrical signal traces at the second outer surface and defining a mating end, the electrical signal traces at the second outer surface arranged in pairs of immediately adjacent signal traces along the lateral direction;
a plurality of electrical ground traces at the second outer surface and defining mating ends and termination ends opposite the mating ends along the longitudinal direction, the electrical ground traces at the second outer surface defining pairs of immediately adjacent ground traces along the lateral direction, wherein respective pairs of ground traces at the second outer surface are disposed between pairs of immediately adjacent signal traces at the second outer surface; and
a second plurality of electrically conductive bridges at the second outer surface that are electrically and mechanically connected to first and second ground traces of respective pairs of immediately adjacent ground traces of the second outer surface that are disposed between immediately adjacent pairs of signal traces of the second outer surface, wherein the electrically conductive bridges at the second outer surface are isolated from all signal traces, and the bridges at the second outer surface do not contact each other.

9. The substrate as recited in claim 8, wherein the electrically conductive via connects to a respective one of the electrically conductive bridges at the first outer surface and a respective one of the electrically conductive bridges at the second outer surface.

10. The substrate as recited in claim 9, wherein the electrically conductive bridges at the first outer surface are alternatingly arranged with the electrically conductive bridges at the second outer surface along the lateral direction.

11. The substrate as recited in claim 10, wherein the via places the electrically conductive bridges at the first outer surface in electrical communication with the electrically conductive bridges at the second outer surface.

12. The substrate as recited in claim 8, further comprising a second electrically conductive ground plate disposed between the first outer surface and the second outer surface, wherein the second ground plate is aligned with the mating ends of the ground traces of the second outer surface along the transverse direction, and no portion of the second ground plate is aligned with the mating ends of the signal traces of second first outer surface along the transverse direction.

13. The substrate of claim 12, wherein the electrically conductive ground plate disposed between the first outer surface and the second outer surface ground plate is a first ground plate, the second ground plate is disposed between the first ground plate and the second outer surface, and the electrically conductive vias extends from the bridges, respectively at the first outer surface, the first ground plate, to the second ground plate, and to the bridges, respectively at the second outer surface.

14. The substrate of claim 13, wherein the first and second ground plates comprise one of a metal and a lossy material.

15. The substrate of claim 8, wherein the electrical signal traces and the electrical ground traces at the first outer surface are staggered with respect to the electrical signal traces and the electrical ground traces at the second outer surface.

* * * * *